US012739981B2

(12) United States Patent
Ikeda et al.

(10) Patent No.: US 12,739,981 B2
(45) Date of Patent: Sep. 15, 2026

(54) WIRING CIRCUIT BOARD HAVING A CONDUCTIVE LAYER WITH A VIA PORTION

(71) Applicant: NITTO DENKO CORPORATION, Osaka (JP)

(72) Inventors: Takahiro Ikeda, Osaka (JP); Teppei Niino, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 683 days.

(21) Appl. No.: 17/973,186

(22) Filed: Oct. 25, 2022

(65) Prior Publication Data

US 2023/0133282 A1 May 4, 2023

(30) Foreign Application Priority Data

Oct. 29, 2021 (JP) ................................ 2021-177287

(51) Int. Cl.
*H05K 3/46* (2006.01)
*H05K 1/05* (2006.01)
(Continued)

(52) U.S. Cl.
CPC ................ *H05K 3/46* (2013.01); *H05K 1/05* (2013.01); *H05K 1/09* (2013.01); *H05K 1/115* (2013.01);
(Continued)

(58) Field of Classification Search
CPC .. H05K 3/46; H05K 1/05; H05K 1/09; H05K 1/115; H05K 3/061; H05K 1/056;
(Continued)

(56) References Cited

U.S. PATENT DOCUMENTS 6,803,528 B1 10/2004 Koyanagi
2003/0039106 A1 2/2003 Koyanagi et al.
(Continued)

FOREIGN PATENT DOCUMENTS

JP H02-058899 A 2/1990
JP 2000309887 A * 11/2000
(Continued)

OTHER PUBLICATIONS

Office Action issued by the Japanese Patent Office on Nov. 11, 2025, in connection with Japanese Patent Application No. 2021-177287.
(Continued)

*Primary Examiner* — Alonzo Chambliss
(74) *Attorney, Agent, or Firm* — Edwards Neils LLC; Jean C. Edwards, Esq.

(57) ABSTRACT

A wiring circuit board includes a metal support board, a first metal thin film, an insulating layer, a second metal thin film, and a conductive layer in a thickness direction order. The insulating layer includes a through hole penetrating in the thickness direction, which includes a first opening end at the first metal thin film side, a second opening end opposite to the first opening end, and an inner wall surface between the first and second opening ends. The first metal thin film includes a first opening portion, which overlaps the first opening end in a projection view in the thickness direction. The second metal thin film includes a second opening portion, which overlaps the first opening portion and the second opening end in a projection view in the thickness direction. The conductive layer has a via portion disposed in the through hole and connected to the metal support board.

20 Claims, 18 Drawing Sheets

(51) Int. Cl.

| | |
|---|---|
| ***H05K 1/09*** | (2006.01) |
| ***H05K 1/11*** | (2006.01) |
| ***H05K 3/06*** | (2006.01) |
| ***H05K 3/42*** | (2006.01) |
| ***H05K 3/44*** | (2006.01) |

(52) U.S. Cl.
CPC ............. *H05K 3/061* (2013.01); *H05K 3/429* (2013.01); *H05K 2201/0317* (2013.01); *H05K 2201/0338* (2013.01); *H05K 2201/09554* (2013.01)

(58) Field of Classification Search
CPC ........... H05K 3/429; H05K 2201/0317; H05K 2201/09554
See application file for complete search history.

(56) References Cited

U.S. PATENT DOCUMENTS

| | | | |
|---|---|---|---|
| 2010/0326709 A1 | 12/2010 | Kawano et al. | |
| 2019/0313528 A1 | 10/2019 | Kuwajima et al. | |
| 2019/0371717 A1 | 12/2019 | Kita et al. | |
| 2021/0212196 A1 | 7/2021 | Ito et al. | |
| 2022/0007507 A1 | 1/2022 | Fukushima et al. | |
| 2024/0015884 A1* | 1/2024 | Shibata | H05K 1/092 |
| 2024/0260177 A1* | 8/2024 | Takimoto | H05K 1/056 |

FOREIGN PATENT DOCUMENTS

| | | | |
|---|---|---|---|
| JP | 2001-144441 | A | 5/2001 |
| JP | 2001-308478 | A | 11/2001 |
| JP | 2007-088056 | A | 4/2007 |
| JP | 2019-186337 | A | 10/2019 |
| JP | 2019-212659 | A | 12/2019 |
| TW | 202031104 | A | 8/2020 |
| WO | 2011/002022 | A1 | 1/2011 |

OTHER PUBLICATIONS

Office Action issued by the Japanese Patent Office on Jun. 3, 2025, in connection with Japanese Patent Application No. 2021-177287.

Office Action was issued by the Korean Patent Office on Feb. 19, 2026, in connection with Korean Patent Application No. 10-2022-0133831.

Office Action which was issued by the Taiwanese Intellectual Property Office on Jun. 24, 2026, in connection with Taiwanese Patent Application No. 111140252.

* cited by examiner 51
41
71
30A(H)
32
10a
52
42a(42)
72
60
50
51
71
41
40
52a
D
30
20
10
33
31
40A
20A(H)
32
40A
31
20A
R

WIRING CIRCUIT BOARD HAVING A CONDUCTIVE LAYER WITH A VIA PORTION

CROSS-REFERENCE TO RELATED APPLICATION

The present application claims priority from Japanese Patent Application No. 2021-177287 filed on Oct. 29, 2021, the contents of which are hereby incorporated by reference into this application.

BACKGROUND ART

The present invention relates to a wiring circuit board and a method of producing the same.

Wiring circuit boards each including a metal support board, an insulating layer on the metal support board, and a wiring pattern, i.e., a wiring layer on the insulating layer are known. In the wiring circuit board, for example, a metal thin film for ensuring the adhesion of the insulating layer to the metal support board is provided between the metal support board and the insulating layer. The techniques related to the wiring circuit board are disclosed in, for example, Patent Document 1 described below.

CITATION LIST

Patent Document

Patent Document 1: Japanese Unexamined Patent Publication No. 2019-212659

SUMMARY OF THE INVENTION

Problem to be Solved by the Invention

The wiring circuit board includes, for example, a via that penetrates the insulating layer in the thickness direction to electrically connect the metal support board and the wiring pattern. Such a wiring circuit board is conventionally produced, for example, as follows.

First, a metal thin film, i.e., a first metal thin film is formed on a metal support board. Next, an insulating layer having a via hole is formed on the first metal thin film (insulating layer formation step). The insulating layer formation step includes a heating process. Next, a seed layer is formed on the insulating layer. The seed layer is formed also in the via hole. In the via hole, the seed layer is formed to cover the exposed surface of the first metal thin film and the inner wall surface of the via hole. The seed layer is a metal thin film, i.e., a second metal thin film. Next, a conductive layer is formed on the seed layer. The conductive layer includes a first conductive portion having a predetermined pattern on the insulating layer and a second conductive portion in the via hole. Next, the part of the seed layer that is not covered with the conductive layer is removed. In this manner, a wiring pattern composed of the seed layer and the first conductive portion thereon is formed on the insulating layer. Further, a via composed of the seed layer and the second conductive portion thereon is formed on the first metal thin film in the via hole.

In the insulating layer formation step in the conventional method as described above, the first metal thin film has an exposed surface at the via hole, and the exposed surface is oxidized in a heating process of the step. Thus, the via is formed on the first metal thin film having the oxidized film on its surface in the via hole. This means that the via in the finished wiring circuit board is electrically connected with the metal support board through the first metal thin film having the oxidized film. Similarly, when the seed layer is made of a material with a relatively high resistance, the via is electrically connected with the metal support board through the seed layer with such a relatively high resistance. Such configurations are not preferable for reducing the resistance of the electrical connection between the metal support board and the wiring layer.

The present invention provides a wiring circuit board suitable for achieving the low-resistance electrical connection between a metal support board and a wiring layer formed on the insulating layer on the board, and a method of producing the wiring circuit board.

Means for Solving the Problem

The present invention [1] includes a wiring circuit board comprising: a metal support board, a first metal thin film, an insulating layer, a second metal thin film, and a conductive layer in this order in a thickness direction, wherein the insulating layer has a through hole penetrating the insulating layer in the thickness direction, the through hole has a first opening end at the first metal thin film side, a second opening end opposite to the first opening end, and an inner wall surface between the first and second opening ends, the first metal thin film has a first opening portion, the first opening portion overlaps the first opening end in a projection view in the thickness direction, the second metal thin film has a second opening portion, the second opening portion overlaps the first opening portion and the second opening end in a projection view in the thickness direction, and the conductive layer has a via portion disposed in the through hole and connected to the metal support board.

The present invention [2] includes the wiring circuit board described in [1], wherein the metal support board includes a metal support layer and a surface metal layer disposed at the insulating layer side of the metal support layer and having a higher conductivity than the metal support layer, and the via portion is connected to the surface metal layer.

The present invention [3] includes the wiring circuit board described in [1] or [2], wherein the first opening portion is open along the first opening end.

The present invention [4] includes the wiring circuit board described in described in any one of [1] to [3], wherein the second metal thin film has a first covering portion on the inner wall surface.

The present invention [5] includes the wiring circuit board described in [4], wherein the second opening portion is open along the first opening portion on the metal support board.

The present invention [6] includes the wiring circuit board described in [4], wherein the second metal thin film has a second covering portion on the metal support board, and the second opening portion is disposed inside the first opening portion on the metal support board.

The present invention [7] includes the wiring circuit board described in described in any one of [1] to [3], wherein the second opening portion is open along the second opening end on the insulating layer.

The present invention [8] includes the wiring circuit board described in described in any one of [1] to [3], wherein the second opening portion is open on the insulating layer, and the second opening end is disposed within the second opening portion in a projection view in the thickness direction.

The present invention [9] includes the wiring circuit board described in [1] or [2], wherein the first metal thin film includes a protruding portion protruding in the first opening end in a projection view in the thickness direction to define the first opening portion, the second metal thin film includes a first covering portion on the inner wall surface and a second covering portion on the protruding portion, and the second opening portion is open along the first opening portion.

The present invention [10] includes a method of producing a wiring circuit board comprising: a first metal thin film forming step of forming a first metal thin film on a one-side surface in a thickness direction of the metal support board; an insulating layer forming step of forming an insulating layer on a one-side surface in the thickness direction of the first metal thin film, the insulating layer having a through hole having a first opening end at the first metal thin film side, a second opening end opposite to the first opening end, and an inner wall surface between the first and second opening ends; a second metal thin film formation step of forming a second metal thin film over a one-side surface in the thickness direction of the insulating layer and the first metal thin film in the through hole; an opening portion formation step of forming an opening portion in the first metal thin film and the second metal thin film, the opening portion overlapping the first opening end and the second opening end in a projection view in the thickness direction, to expose the metal support board at the through hole; and a conductive layer formation step of forming a conductive layer over a one-side surface in the thickness direction of the second metal thin film and the metal support board in the through hole.

The present invention [11] includes a method of producing a wiring circuit board comprising: a first metal thin film forming step of forming a first metal thin film on a one-side surface in a thickness direction of the metal support board; an insulating layer forming step of forming an insulating layer on a one-side surface in the thickness direction of the first metal thin film, the insulating layer having a through hole having a first opening end at the first metal thin film side, a second opening end opposite to the first opening end, and an inner wall surface between the first and second opening ends; a first opening portion formation step of forming a first opening portion in the first metal thin film, the first opening portion being open along the first opening end, to expose the metal support board at the through hole; a second metal thin film formation step of forming a second metal thin film over a one-side surface in the thickness direction of the insulating layer and the metal support board in the through hole; a second opening portion formation step of forming a second opening portion in the second metal thin film, the second opening portion overlapping the first opening end and the second opening end in a projection view in the thickness direction, to expose the metal support board at the through hole; and a conductive layer formation step of forming a conductive layer over a one-side surface in the thickness direction of the second metal thin film and the metal support board in the through hole.

Effects of the Invention

In a projection view in the thickness direction of the wiring circuit board of the present invention, the first opening portion of the first metal thin film overlaps the first opening end of the through hole of the insulating layer and the second opening portion of the second metal thin film overlaps the first opening portion and the second opening end of the through hole. The wiring circuit board of such is suitable for allowing, in the production process, the first opening portion, the through hole, and the second opening portion to once form a space, space for forming the via portion therein, continuous along the thickness direction. In the wiring circuit board, as described above, the via portion of the conductive layer is directly connected to the metal support board without the intervention of the first metal thin film and the intervention of the second metal thin film. The wiring circuit board is suitable for achieving a low-resistance electrical connection between the metal support board and the wiring layer formed on the insulating layer on the board.

The method of producing a wiring circuit board of the present invention is suitable to produce the wiring circuit board described above.

BRIEF DESCRIPTION OF THE DRAWINGS

FIG. 3A illustrates a preparation step. FIG. 3B illustrates a first metal thin film formation step. FIG. 3C illustrates an insulating base layer formation step. FIG. 3D illustrates a second metal thin film formation step.

FIGS. 4A to 4D illustrate the steps subsequent to the step of FIG. 3D. FIG. 4A illustrates an opening portion formation step. FIG. 4B illustrates a conductive layer formation step. FIG. 4C illustrates an etching step. FIG. 4D illustrates an insulating cover layer formation step.

FIG. 18A illustrates a preparation step. FIG. 18B illustrates a first metal thin film formation step. FIG. 18C illustrates an insulating base layer formation step.

FIG. 19A illustrates a first opening portion formation step. FIG. 19B illustrates a second metal thin film formation step. FIG. 19C illustrates a second opening portion formation step.

FIG. 20A illustrates a conductive layer formation step. FIG. 20B illustrates an etching step. FIG. 20C illustrates an insulating cover layer formation step.

DESCRIPTION OF THE EMBODIMENT

Figure 1:
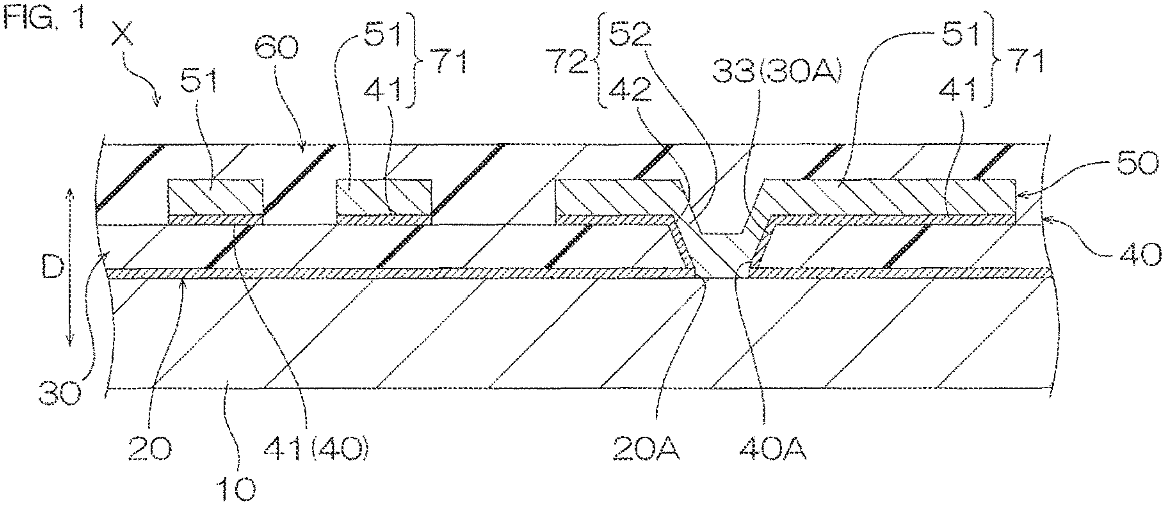
FIG. 1 is a partial cross-sectional view of one embodiment of the wiring circuit board of the present invention.
Figure 2:
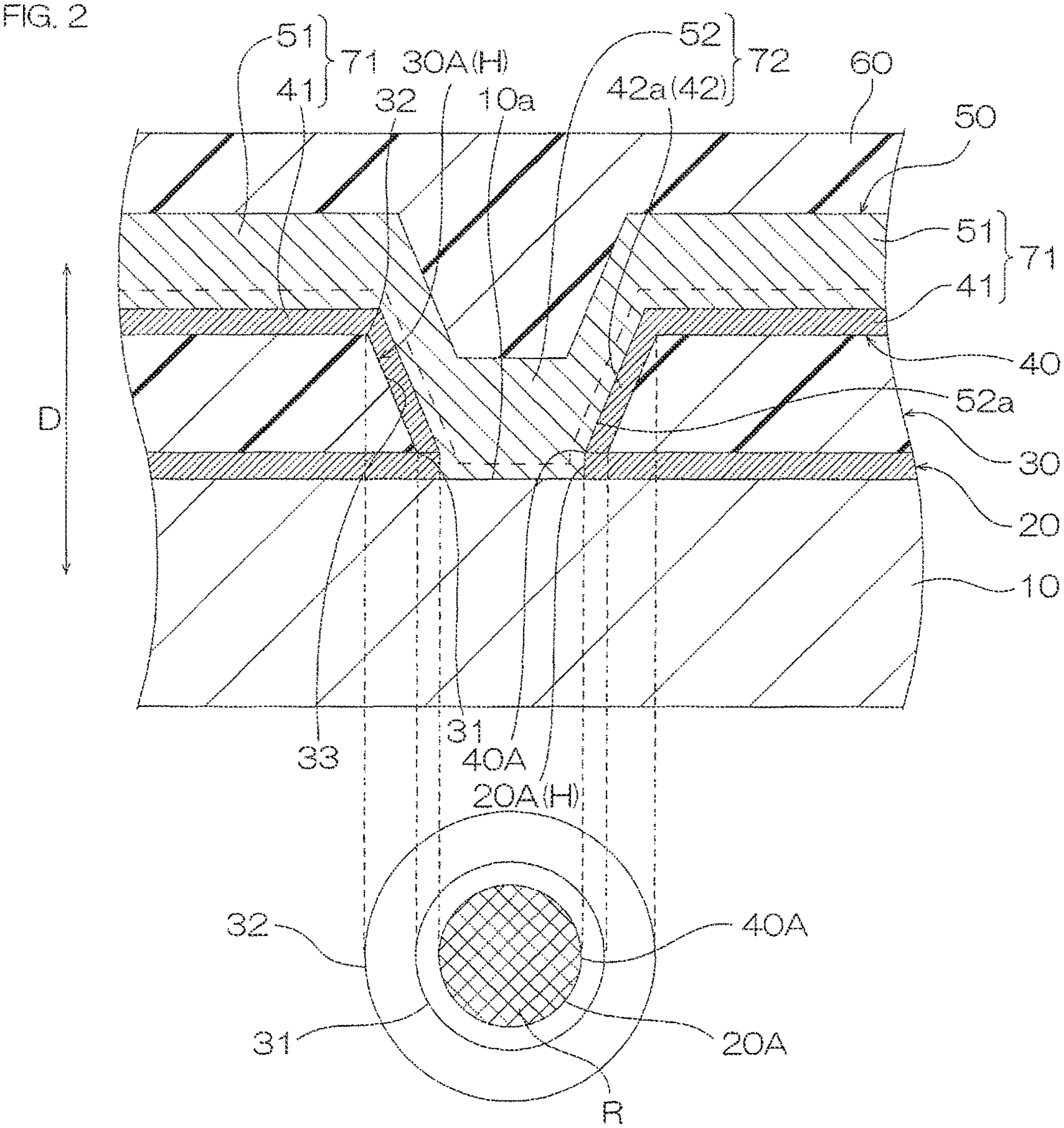
FIG. 2 is an enlarged partial cross-sectional view of the wiring circuit board of FIG. 1.

As shown in FIG. 1 and FIG. 2, a wiring circuit board X that is one embodiment of the wiring circuit board of the present invention includes a metal support board 10, a metal thin film 20, i.e., a first metal thin film, an insulating layer 30 as an insulating base layer, a metal thin film 40, i.e., a second metal thin film, a conductive layer 50, and an insulating layer 60 as an insulating cover layer in this order toward one side in a thickness direction D. The wiring circuit board X extends in a direction orthogonal to the thickness direction D, i.e., a surface direction, and has a predetermined plan-view shape.

The metal support board 10 is a substrate for ensuring the strength of the wiring circuit board X. Examples of the material of the metal support board 10 include stainless steels, copper, copper alloys, aluminum, nickel, titanium, and Alloy 42. An example of the stainless steel includes SUS 304 in conformity with the standards of the American Iron and Steel Institute (AISI). In view of the strength of the metal support board 10, the metal support board 10 preferably contains at least one selected from the group consisting of a stainless steel, a copper alloy, aluminum, nickel, and titanium. More preferably, the metal support board 10 consists of at least one selected from the group consisting of a stainless steel, a copper alloy, aluminum, nickel, and titanium. In view of the simultaneous achievement of the strength and conductivity of the metal support board 10, the metal support board 10 preferably consists of a copper alloy. The metal support board 10 has a thickness of, for example, 15 μm or more. The thickness of the metal support board 10 is, for example, 500 μm or less, preferably 250 μm or less.

The metal thin film 20 is disposed on a one-side surface in the thickness direction D of the metal support board 10. The metal thin film 20 is in contact with the metal support board 10. The metal thin film 20 is a film for ensuring the adhesion of the insulating layer 30 to the metal support board 10. Examples of the metal thin film 20 include a film formed in a sputtering method, i.e., a sputtering film, a film formed in a plating method, i.e., a plating film, and a film formed in a vacuum deposition method, i.e., a vacuum-deposited film.

Examples of the material of the metal thin film 20 include chromium, nickel, and titanium. The material of the metal thin film 20 may be an alloy containing two or more metals selected from the group consisting of chromium, nickel, and titanium. As the material of the metal thin film 20, chromium is preferably used.

The metal thin film 20 has a thickness of, for example, 1 nm or more, preferably 10 nm or more, more preferably 20 nm or more. The thickness of the metal thin film 20 is, for example, 1000 nm or less, preferably 1000 nm or less, more preferably 500 nm or less.

The metal thin film 20 has an opening portion 20A, i.e., a first opening portion penetrating the metal thin film 20 in the thickness direction D. The opening portion 20A has, for example, an approximately circular shape in a plan view. The opening portion 20A has a maximum length in the plan view (a diameter when the opening portion 20A has a circular shape in the plan view) of, for example, 1 μm or more, and, for example, 1000 μm or less depending on the size of a through hole 30A of the insulating layer 30 to be described below. The metal support board 10 has a portion 10*a* facing the opening portion 20A. The portion 10*a* is not covered with the metal thin films 20 and 40.

The insulating layer 30 is disposed on a one-side surface in the thickness direction D of the metal thin film 20. The insulating layer 30 is in contact with the metal thin film 20. Examples of the material of the insulating layer 30 include resin materials such as polyimide, polyether nitrile, polyether sulfone, polyethylene terephthalate, polyethylene naphthalate, and polyvinyl chloride. The same examples apply to the material of an insulating layer 60 to be described below. The insulating layer 30 has a thickness of, for example, 1 μm or more, preferably 3 μm or more. The thickness of the insulating layer 30 is, for example, 35 μm or less.

The insulating layer 30 has a through hole 30A penetrating the insulating layer 30 in the thickness direction D. The through hole 30A has an opening end 31, i.e., a first opening end at a metal thin film 20 side, an opening end 32, i.e., a second opening end opposite to the opening end 31, and an inner wall surface 33 between the opening ends 31 and 32.

The opening end 31 has, for example, an approximately circular shape in a plan view. The opening end 31 has a maximum length in the plan view (a diameter when the opening end 31 has a circular shape in the plan view) of, for example, 1 μm or more, and, for example, 1000 μm or less. In a projection view in the thickness direction D, the opening end 31 overlaps the opening portion 20A of the metal thin film 20 (the positional relationship between the opening end 31 and the opening portion 20A in the projection view in the thickness direction D is schematically shown under the cross-sectional view in FIG. 2). In other words, the opening portion 20A overlaps the opening end 31 in the projection view in the thickness direction D. In the present embodiment, the opening end 31 is open along the opening portion 20A. In other words, the opening portion 20A is open along the opening end 31. Further, in the projection view in the thickness direction D, the opening end 31 includes the opening portion 20A.

The opening end 32 has a maximum length (a diameter when the opening end 32 has a circular shape in the plan view) of, for example, 1 μm or more, and, for example, 1000 μm or less. In the present embodiment, the opening end 32 has a larger area than the opening end 31. In the projection view in the thickness direction D, the opening end 32 includes the opening end 31.

The inner wall surface 33 is inclined in the present embodiment. The inner wall surface 33 is inclined inward as approaching the metal support board 10. In other words, the inner wall surface 33 is inclined so that the cross-sectional area of the opening of the through hole 30A gradually decreases as getting closer to the metal support board 10.

The through hole 30A and the opening portion 20A of the metal thin film 20 form a through hole H.

The metal thin film 40 is disposed directly on a one-side surface in the thickness direction D of the insulating layer 30 and on the inner wall surface 33 of the through hole 30A in the present embodiment. The metal thin film 40 is a seed layer for forming a conductive layer 50. Examples of the metal thin film 40 include a sputtering film, a plating film, and a vacuum-deposited film.

The metal thin film 40 includes a metal thin film 41 disposed outside the through hole H and a metal thin film 42 disposed inside the through hole H. The metal thin film 41 and the metal thin film 42 are connected. The metal thin film 41 has a predetermined patter on the insulating layer 30. The metal thin film 42 covers the whole of the inner wall surface 33. In other words, in the present embodiment, the metal thin film 42 is a covering portion 42*a*, i.e., a first covering portion on the inner wall surface 33. The metal thin film 42 including the covering portion 42*a* helps the growth of the metal on the covering portion 42*a* and the appropriate formation of the via portion 52 in the conductive layer formation step described below and illustrated in FIG. 4B. Further, the metal thin film 42 is connected to the metal thin film 20 in the through hole H.

The metal thin film 40 has an opening portion 40A, i.e., a second opening portion penetrating the metal thin film 40 in the thickness direction D. The opening portion 40A is in the through hole H in the present embodiment. The opening portion 40A has, for example, an approximately circular shape in a plan view. The opening portion 40A has a maximum length in the plan view (a diameter when the opening portion 40A has a circular shape in the plan view) of, for example, 1 μm or more, and, for example, 1000 μm or less, depending on the size of the through hole 30A.

In the projection view in the thickness direction D, the opening portion 40A overlaps the opening portion 20A of the metal thin film 20 and the opening end 32 of the through hole 30A. The positional relationship between the opening portion 20A, the opening portion 40A, and the opening end 32 in the projection view in the thickness direction D is schematically shown under the cross-sectional view in FIG. 2. In the present embodiment, the opening portion 40A is open along the opening portion 20A on the metal support board 10.

Examples of the material of the metal thin film 40 include chromium, copper, nickel, and titanium. The material of the metal thin film 40 may be an alloy containing two or more metals selected from the group consisting of chromium, copper, nickel, and titanium. As the material of the metal thin film 40, chromium is preferably used. The metal thin film 40 may have a single-layered structure or a multi-layered structure with two or more layers. When the metal thin film 40 has a single-layered structure, the metal thin film 40 is preferably a chromium layer. When the metal thin film 40 has a multi-layered structure, the metal thin film 40 is preferably composed of a chromium layer as a lower layer and a copper layer on the chromium layer.

The metal thin film 40 has a thickness of, for example, 1 nm or more, preferably 10 nm or more. The thickness of the metal thin film 40 is, for example, 500 nm or less, preferably 200 nm or less.

The conductive layer 50 is disposed directly on a one-side surface in the thickness direction D of the metal thin film 40 and on the portion 10*a*, i.e., a part of the metal support board 10 in the through hole H. The conductive layer 50 includes a wiring portion 51 disposed outside the through hole H and a via portion 52 disposed inside the through hole H. The wiring portion 51 has a predetermined pattern shape. A part of the wiring portion 51 is connected to the via portion 52. The via portion 52 has a concave shape in the vertical cross section illustrated in FIG. 2. The via portion 52 has an inclined peripheral side surface 52*a*. The peripheral side surface 52*a* is inclined inward as getting closer to the metal support board 10. In other words, the peripheral side surface 52*a* is inclined so that the horizontal cross-sectional area of the via portion 52 gets smaller as getting closer to the metal support board 10. Further, the via portion 52 is connected to the metal support board 10. Specifically, the via portion 52 is directly connected to the metal support board 10 without the interventions of the metal thin films 20 and 40.

Examples of the conductive layer 50 include copper, nickel, and gold. The material of the conductive layer 50 may be an alloy containing two or more metals selected from the group consisting of copper, nickel, and gold. As the material of the conductive layer 50, copper is preferably used.

The metal thin film 41 and the wiring portion 51 on the metal thin film 41 form a wiring layer 71 having a predetermined pattern shape on the insulating layer 30. The metal thin film 42 and the via portion 52 form a via 72 in the through hole H. The metal support board 10 is electrically connected with a part of the wiring layer 71 through the via 72. The wiring layer 71 can be electrically connected with a ground through the via 72 and the metal support board 10.

The wiring layer 71 has a thickness of, for example, 3 μm or more, preferably 5 μm or more. The thickness of the wiring layer 71 is, for example, 50 μm or less, preferably 30 μm or less. The wiring layer 71 has a width (a dimension in a direction orthogonal to a direction in which the wiring layer 71 extends) of, for example, 5 μm or more, preferably 8 μm or more. The width of the wiring layer 71 is, for example, 100 μm or less, preferably 50 μm or less.

The insulating layer 60 is disposed directly on the one-side surface in the thickness direction D of the insulating layer 30 to cover the wiring layer 71 and the via 72. The insulating layer 60 has a thickness of, for example, 4 μm or more, preferably 6 μm or more. The thickness of the insulating layer 60 (the height from the insulating layer 30) is, for example, 60 μm or less, preferably 40 μm or less. The insulating layer 60 may have an opening portion at which the wiring layer 71 and/or the via 72 are/is partially exposed. In other words, the insulating layer 60 may have an opening portion, and the wiring layer 71 and/or the via 72 may be exposed at the opening portion. The part(s) of the wiring layer 71 and/or the via 72 exposed at the opening portion can function as, for example, a terminal portion of the wiring circuit board X.

In the projection view of the wiring circuit board X in the thickness direction D, as described above, the opening portion 20A of the metal thin film 20 overlaps the opening end 31 of the through hole 30A of the insulating layer 30 while the opening portion 40A of the metal thin film 40 overlaps the opening portion 20A and the opening end 32 of the through hole 30A. In the present embodiment, the opening portion 20A substantively coincides with the opening portion 40A in the projection view in the thickness direction D. In the schematic projection view of FIG. 2, a region R in which all the opening portion 20A, the opening portion 40A, the opening end 31, and the opening end 32 overlap each other is hatched with crossed lines.

The wiring circuit board X of such is suitable for allowing, in the production process, the opening portion 20A, through hole 30A, and opening portion 40A to once form a space, space for forming the via portion therein, continuous along the thickness direction D. The region R continues over the opening portion 20A, the through hole 30A, and the opening portion 40A in the thickness direction D. Further, in the wiring circuit board X as described above, the via portion 52 of the conductive layer 50 is directly connected to the metal support board 10 without the interventions of the metal thin films 20 and 40. The wiring circuit board X is suitable for achieving a low-resistance electrical connection between the metal support board 10 and the wiring layer 71 on the insulating layer 30.

In the wiring circuit board X, as described above, the metal thin film 40 includes the metal thin film 42 in the through hole 30A of the insulating layer 30. Further, the metal thin film 42 is connected to the metal thin film 20 on the metal support board 10. Furthermore, the opening portion 40A is open along the opening portion 20A of the metal thin film 20. Such a structure helps the growth of the metal on the covering portion 42*a* and the appropriate formation of the via portion 52 in the conductive layer formation step described below and illustrated in FIG. 4B.

FIGS. 3A to 3D and FIGS. 4A to 4D show a method of producing the wiring circuit board X as one embodiment of the method of producing the wiring circuit board of the present invention. FIGS. 3A to 3D and FIGS. 4A to 4D show the change in the cross-section corresponding to FIG. 1 as the production method of the wiring circuit board X.

Figure 3A:
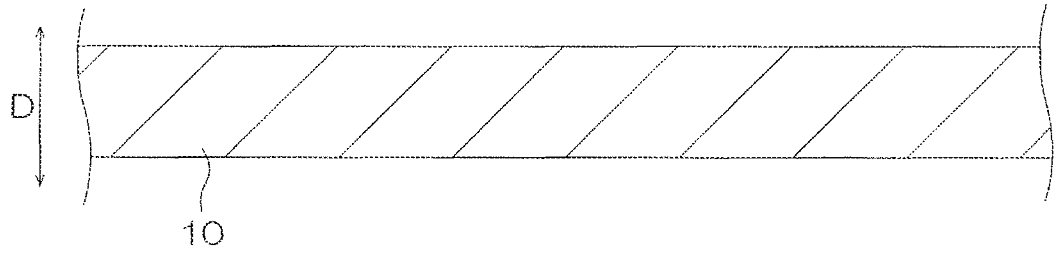
FIGS. 3A to 3D illustrate some steps of one embodiment of the method of producing the wiring circuit board of the present invention.

In the production method, the metal support board 10 is prepared as shown in FIG. 3A (preparation step).

Figure 3B:
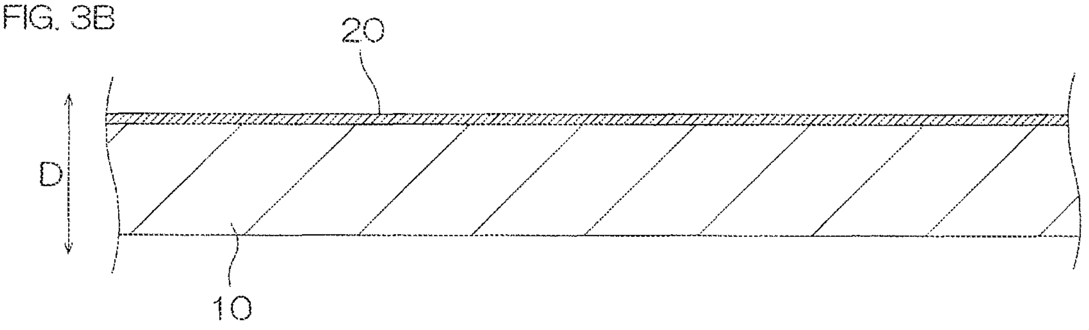

Next, as shown in FIG. 3B, the metal thin film 20 is formed on a one-side surface in the thickness direction D of the metal support board 10 (first metal thin film formation step). Examples of the method of forming the metal thin film 20 include a sputtering method, a vacuum deposition method, and a plating method. Examples of the plating method include an electrolytic plating method and an electroless plating method. The metal thin film 20 is preferably formed by a sputtering method.

Figure 3C:
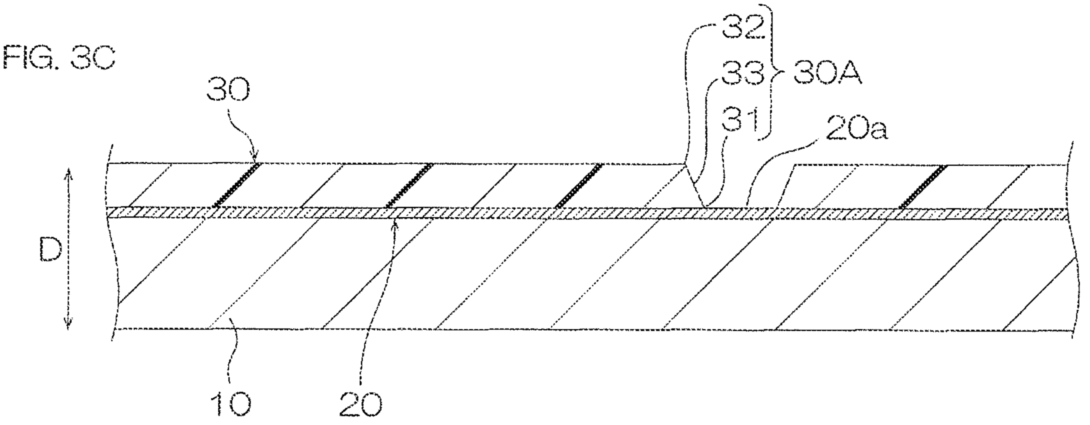

Next, as shown in FIG. 3C, the insulating layer 30 is formed on the one-side surface in the thickness direction D of the metal thin film 20 (insulating base layer formation step). In this step, the insulating layer 30 is formed, for example, as follows. First, a solution (varnish) of photosensitive resin is applied on the metal thin film 20 to form a film. Next, the film is dried by heating. Next, the dried film is subjected to an exposure process through a predetermined mask, and subsequently a development process. If needed, a baking process follows the development process. In this exemplary manner, the insulating layer 30 including the through hole 30A is formed on the metal thin film 20. The through hole 30A includes, as described above, the opening end 31, i.e., the first opening end at the metal thin film 20 side, the opening end 32, i.e., the second opening end opposite to the opening end 31, and the inner wall surface 33 between the opening ends 31 and 32. At the through hole 30A as described above, the portion 20*a* of the metal thin film 20 is exposed. The exposed surface of the portion 20*a* shown at the upper side of FIG. 3C is oxidized through the heating process included in this step.

Figure 3D:
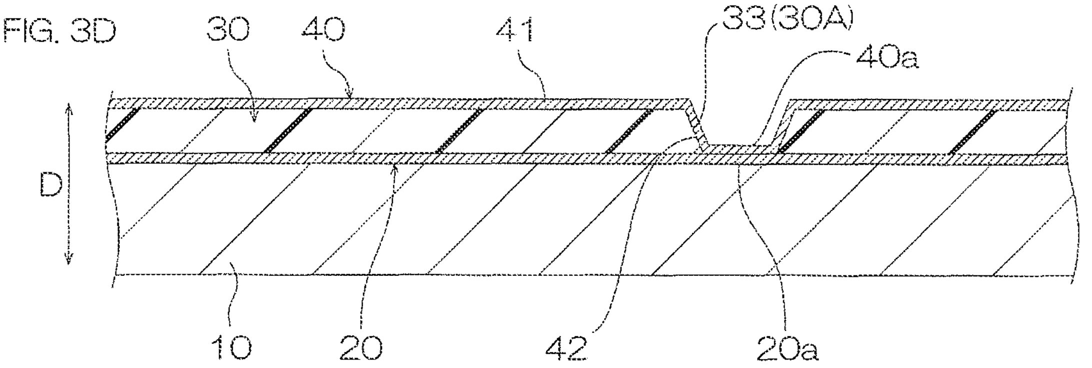

Next, as shown in FIG. 3D, the metal thin film 40 is formed as a seed layer (second metal thin film formation step). In this step, the metal thin film 40 is formed continuously on the one-side surface in the thickness direction D of the insulating layer 30, on the inner wall surface 33 of the through hole 30A, and on the portion 20*a* of the metal thin film 20 exposed at the through hole 30A. This means that the metal thin film 40 includes the metal thin film 41 outside the through hole 30A and the metal thin film 42 inside the through hole 30A. Examples of the method of forming the metal thin film 40 include a sputtering method, a vacuum deposition method, and a plating method. Examples of the plating method include an electrolytic plating method and an electroless plating method. The metal thin film 40 is preferably formed by a sputtering method.

Figure 4A:
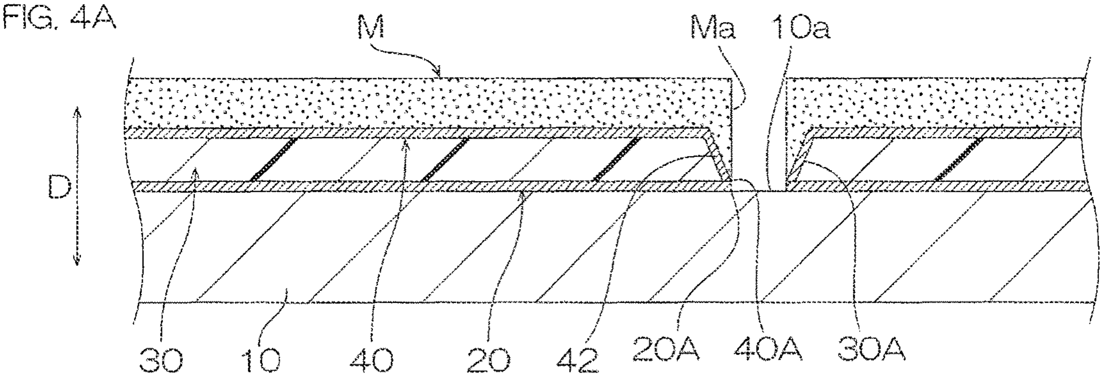

Next, shown in FIG. 4A, the opening portions 20A and 40A are formed in the metal thin films 20 and 40, respectively (opening portion formation step). A specific example of the formation is as follows.

An etching mask M is formed on the metal thin film 40. The etching mask M includes an etching opening portion Ma. In a plan view, the etching opening portion Ma has a shape corresponding to the shape of the opening portion 40A. In the formation of the etching mask M, first, a photosensitive resist film is bonded onto the metal thin film 40 to form a resist film. Next, the resist film is subjected to an exposure process through a predetermined mask and subsequently a development process. If needed, a baking process follows the development process. In this manner, the etching opening portion Ma is formed, and the etching opening portion Ma corresponds to the opening portions 20A and 40A to be formed in the metal thin films 20 and 40.

In this step, next, the metal thin films 20 and 40 are subjected to an etching process through the etching mask M on the metal thin film 40. This etching process removes the part of the metal thin film 40 facing the etching opening portion Ma. Subsequently, the part of the metal thin film 20 facing the etching opening portion Ma is removed. In this manner, the opening portions 20A and 40A are formed. Thereafter, the etching mask M is removed from the metal thin film 40. Examples of the etching process include wet etching and dry etching. Wet etching is preferred. Examples of the etching solution used in the wet etching include a ceric ammonium nitrate solution, a caustic soda solution, a potassium permanganate solution, and a sodium metasilicate solution. Preferably, a ceric ammonium nitrate solution is used. In the wet etching, the etching solution has a temperature of, for example, 20° C. or more, preferably, 30° C. or more. The temperature of the etching solution is, for example, 80° C. or less, preferably, 65° C. or less. The wet etching is carried out for an etching time of, for example, 1 minute or more. The etching time is, for example, 15 minutes or less, preferably 10 minutes or less.

As described above in this step, the opening portions 20A and 40A are formed in the metal thin films 20 and 40, respectively. The opening portions 20A and 40A overlap opening ends 31 and 32 of the through hole 30A in a projection view in the thickness direction D. Thus, this step exposes the metal support board 10 at the through hole 30A.

Figure 4B:
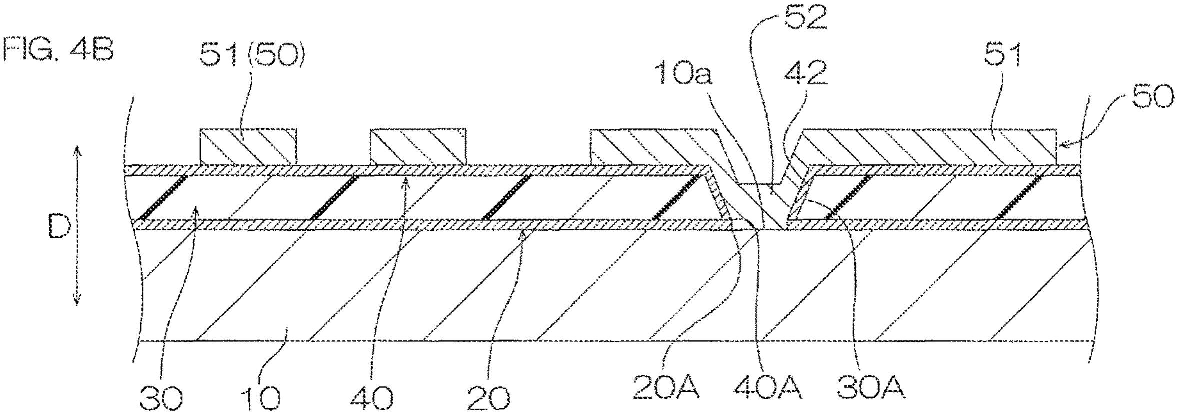

Next, as shown in FIG. 4B, the conductive layer 50 is formed on a one-side surface in the thickness direction D of the metal thin film 40 and on the metal support board 10 in the through hole 30A (conductive layer formation step). A specific example of the formation is as follows.

First, a resist pattern is formed on the metal thin film 40. The resist pattern includes an opening portion while, in a plan view, the opening portion has a shape corresponding to the shape of the pattern of the conductive layer 50. In the formation of the resist pattern, first, a photosensitive resist film is bonded onto the metal thin film 40 to form a resist film. Next, the resist film is subjected to an exposure process through a predetermined mask and subsequently a development process. If needed, a baking process follows the development process. In the formation of the conductive layer 50, next, an electrolytic plating method is carried out to allow the above-describe metal to grow on the metal thin film 40 in the opening portion of the resist pattern. In the electrolytic plating method, the metal thin film 20 and the metal support board 10 are used in combination as a power supplying path member for the electrolytic plating. Next, the resist pattern is removed. In this exemplary manner, the conductive layer 50 having a predetermined pattern including the wiring portion 51 and the via portion 52 is formed on the one-side surface in the thickness direction D of the metal thin film 40.

Figure 4C:
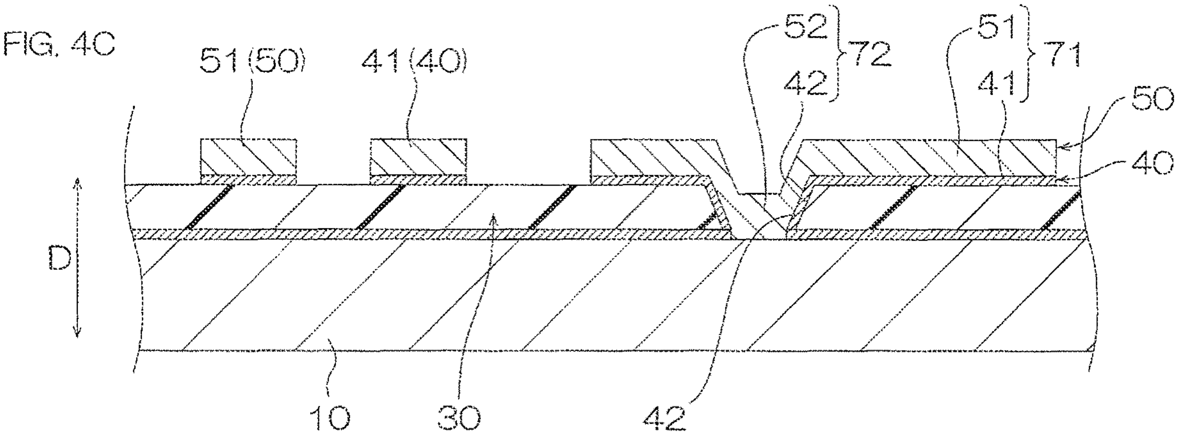
Figure 4C:
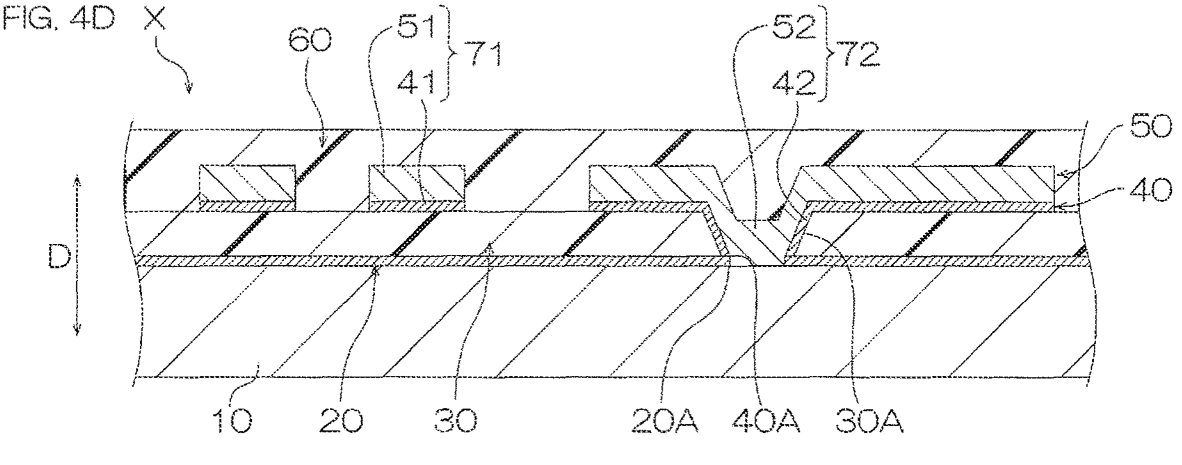

In this production method, next as shown in FIG. 4C, the part of the metal thin film 40 that is not covered with the conductive layer 50 is removed by etching (etching step). In this manner, the wiring layer 71 (the wiring portion 51 and the metal thin film 41) and the via 72 (the via portion 52 and the metal thin film 42) are formed. After this step, for example, an electroless plating method or an electrolytic plating method may be carried out to form a nickel film on a surface of the wiring layer 71.

Next, as shown in FIG. 4D, the insulating layer 60 is formed on the insulating layer 30 to cover the wiring layer 71 and the via 72 (insulating cover layer formation step). In this step, the insulating layer 60 is formed, for example, as follows. First, a solution (varnish) of photosensitive resin is applied on the insulating layer 30 and on the wiring layer 71 and the via 72 to form a film. Next, the film is dried. Next, the dried film is subjected to an exposure process through a predetermined mask and subsequently a development process. If needed, a baking process follows the development process. As exemplified above, the insulating layer 60 is formed as an insulating cover layer.

As described above, the wiring circuit board X is produced.

In the insulating base layer formation step of the present production method as shown in FIG. 3C, the surface of the portion 20*a* of the metal thin film 20 facing the through hole 30A is oxidized. In the second metal thin film formation step as shown in FIG. 3D, the metal thin film 40 is formed as a seed layer continuously on the insulating layer 30 and on the portion 20*a* inside the through hole 30A. As the material of the metal thin film 40, chromium is preferably used as described above. Chromium has a higher resistance than, for example, copper and is a conductor with a relatively high resistance. However, in the opening portion formation step as shown in FIG. 4A, the portions 20*a* and 40*a* of the metal thin films 20 and 40 are removed. In this manner, a part of the metal support board 10, i.e., the portion 10*a* is exposed. Accordingly, the via portion 52, which is formed in the conductive layer formation step as shown in FIG. 4B, is directly connected to the portion 10*a* of the metal support board 10.

As described above, the present production method allows the formation of the wiring circuit board X where the via portion 52 is directly connected to the metal support board 10. This means that the metal thin films 20 and 40 do not intervene in the electrical connection between the via portion 52 and the metal support board 10. Thus, the present production method is suitable for achieving a low-resistance electrical connection between the metal support board 10 and the wiring layer 71 in the wiring circuit board X.

Figure 5A:
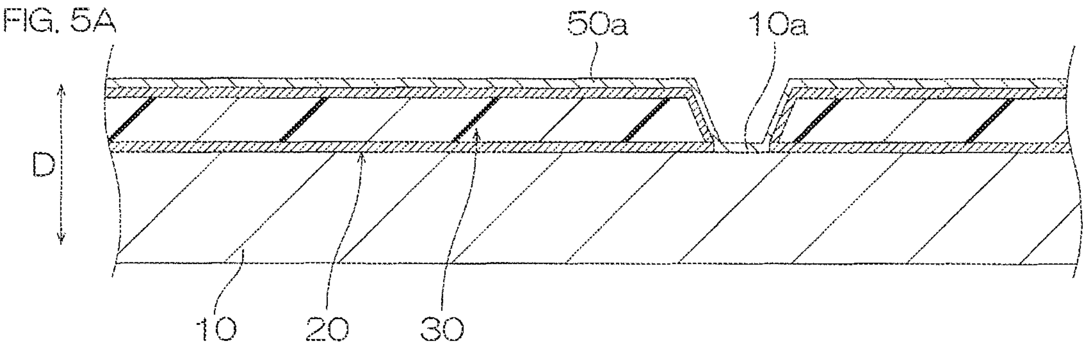
FIGS. 5A to 5C illustrate a variation of the conductive layer formation step and the etching step.
Figure 5B:
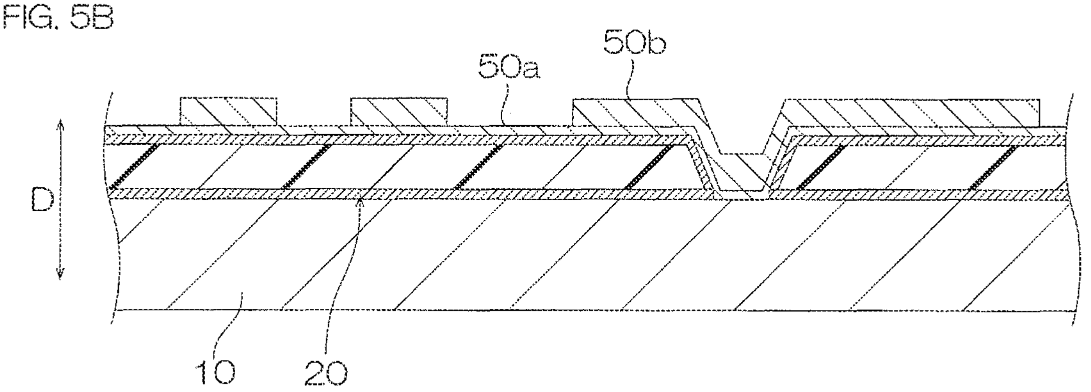
Figure 5C:
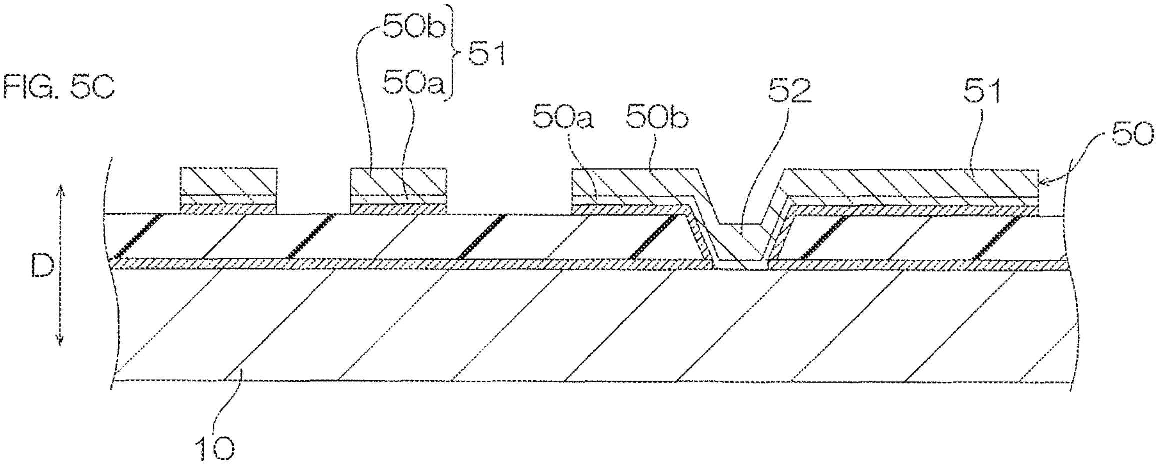

After the opening portion formation step as shown in FIG. 4A in the present production method, the conductive layer formation step shown in FIGS. 5A and 5B and the subsequent etching step as shown in FIG. 5C may be carried out instead of the conductive layer formation step as shown in FIG. 4B and the etching step as shown in FIG. 4C.

In the conductive layer formation step, as shown in FIG. 5A, a conductive thin film 50*a* is formed first. Examples of the material of the conductive thin film 50*a* include the materials exemplifying the material of the conductive layer 50. Copper is preferably used. Examples of the method of forming the conductive thin film 50*a* include a sputtering method and a vacuum deposition method. The conductive thin film 50*a* is preferably formed by a sputtering method. The conductive thin film 50*a* has a thickness of, for example, 1 nm or more, preferably 10 nm or more, and, for example, 500 nm or less, preferably 200 nm or less.

Next, as shown in FIG. 5B, a conductive layer 50*b* is formed on a one-side surface in the thickness direction D of the conductive thin film 50*a*. Specifically, the conductive layer 50*b* is formed by an electrolytic plating method in the same manner as the method of forming the conductive layer 50 described above with reference to FIG. 4B. In this electrolytic plating method, the metal thin film 20 and the conductive thin film 50*a* are used as a power supplying path member for the electrolytic plating. Preferably, the metal thin film 20, the conductive thin film 50*a*, and the metal support board 10 are used in combination. The use in combination facilitates the appropriate formation of the via portion 52.

In the subsequent etching step as shown in FIG. 5C, the regions of the metal thin film 40 and the conductive thin film 50*a* on which the conductive layer 50*b* is not formed are removed by etching. In this manner, the wiring layer 71 (the wiring portion 51 and the metal thin film 41) and the via 72 (the via portion 52 and the metal thin film 42) are formed. The wiring portion 51 and the via portion 52 are each formed from the conductive thin film 50*a* and the conductive layer 50*b* thereon. The dotted line of FIG. 2 shows the boundary between the conductive thin film 50*a* and the conductive layer 50*b* when the conductive layer 50 is formed as described above. The same applies to the variations described below.

Figure 6:
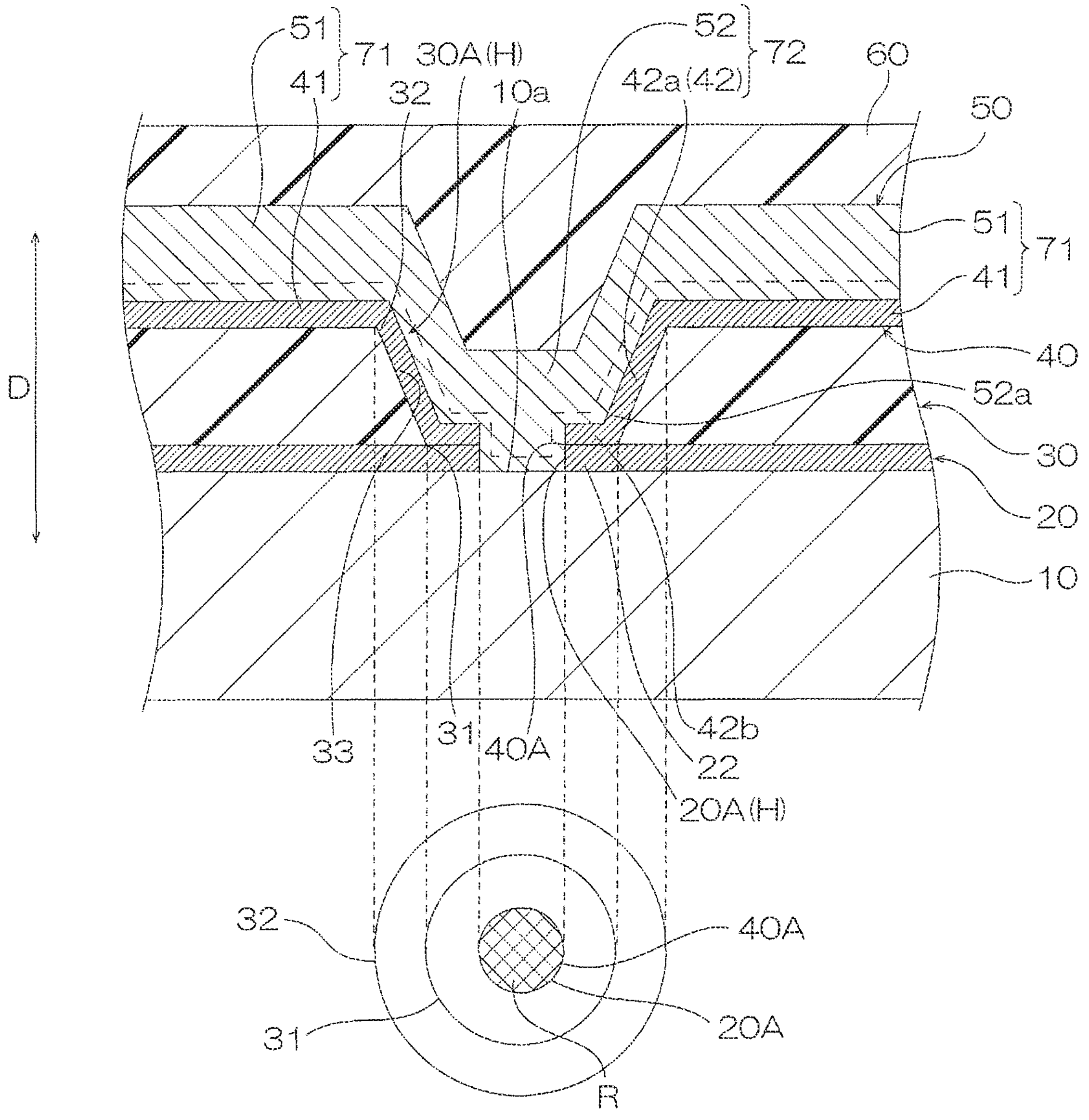
FIG. 6 is an enlarged partial cross-sectional view of the first variation of the wiring circuit board of FIG. 1.

In the wiring circuit board X, as shown in FIG. 6, the metal thin film 20 may include a protruding portion 22 while the metal thin film 40 may include a covering portion 42*b* in addition to the covering portion 42*a* in the through hole H. The protruding portion 22 protrudes into the opening end 31 of the through hole 30A to define the opening portion 20A in a projection view in the thickness direction D. The covering portion 42*b* covers the protruding portion 22. Then, the opening portion 40A of the metal thin film 40 is open along the opening portion 20A.

The schematic view under the cross-sectional view in FIG. 6 shows the positional relationship between the opening portion 20A of the metal thin film 20, the opening ends 31 and 32 of the through hole 30A, and the opening portion 40A of the metal thin film 40 in a projection view of the variation, i.e., the first variation of the wiring circuit board X in the thickness direction D. In the projection view in the thickness direction D, the opening portion 20A overlaps the opening end 31 while the opening portion 40A overlaps the opening portion 20A and the opening end 32. In the projection view of the present variation in the thickness direction D, the opening portion 20A and the opening portion 40A substantively coincide with each other. In the schematic projection view of FIG. 6, the region in which all the opening portion 20A, the opening portion 40A, the opening end 31, and the opening end 32 overlap each other is hatched with crossed lines. This applies to the drawings of the variations described below.

The first variation is produced in the same manner as the production method described above except for the following. The etching mask M used in the opening portion formation step shown in FIG. 4A includes, an etching opening portion Ma with a smaller diameter than the opening end 31 of the through hole 30A, where the etching opening portion Ma is within the opening end 31 in a projection view in the thickness direction D.

The first variation as described above is also suitable for allowing, in the production process, the opening portion

20A, the through hole 30A, and the opening portion 40A to once form a space, space for forming the via portion therein, continuous along the thickness direction D. The region R continues over the opening portion 20A, the through hole 30A, and the opening portion 40A in the thickness direction D. Further, the via portion 52 of the conductive layer 50 is directly connected to the metal support board 10 without the interventions of the metal thin films 20 and 40. Accordingly, the first variation of the wiring circuit board X is also suitable for achieving a low-resistance electrical connection between the metal support board 10 and the wiring layer 71 on the insulating layer 30. The following applies to the variations described below: the wiring circuit board has a region in which all the opening portion 20A, the opening portion 40A, the opening end 31, and the opening end 32 overlap each other in a projection view in the thickness direction D; thus the variation is also suitable for allowing, in the production process, the opening portion 20A, the through hole 30A, and the opening portion 40A to once form a space, space for forming the via portion therein, continuous along the thickness direction D; and therefore the variation is also suitable for achieving the low-resistance electrical connection between the metal support board 10 and the wiring layer 71 on the insulating layer 30.

Figure 7:
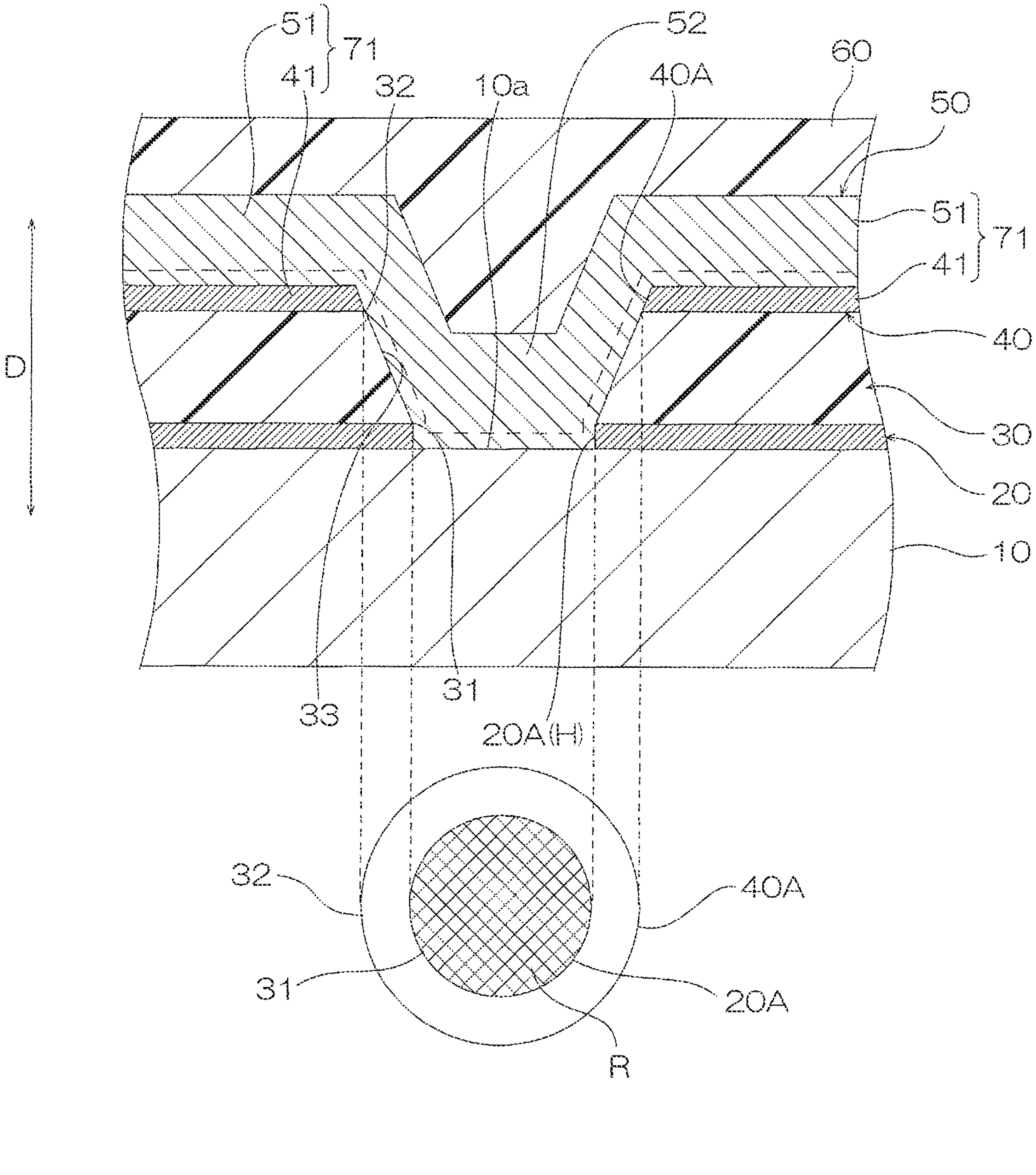
FIG. 7 is an enlarged partial cross-sectional view of the second variation of the wiring circuit board of FIG. 1.

In the wiring circuit board X, as shown in FIG. 7, the opening portion 40A of the metal thin film 40 may be open along the opening end 32 of the through hole 30A on the insulating layer 30 while the opening portion 20A of the metal thin film 20 may be open along the opening end 31 of the through hole 30A on the metal support board 10. In such a case, the metal thin film 40 does not include the metal thin film 42 in the through hole 30A.

The schematic view under the cross-sectional view in FIG. 7 shows the positional relationship between the opening portion 20A of the metal thin film 20, the opening ends 31 and 32 of the through hole 30A, and the opening portion 40A of the metal thin film 40 in a projection view of the variation, i.e., the second variation of the wiring circuit board X in the thickness direction D. In the projection view in the thickness direction D, the opening portion 20A overlaps the opening end 31 while the opening portion 40A overlaps the opening portion 20A and the opening end 32. In the projection view of the present variation in the thickness direction D, the opening portion 20A and the opening end 31 substantively coincide with each other while the opening portion 40A and the opening end 32 substantively coincide with each other.

The second variation is produced in the same manner as the production method described above except for the following. The etching mask M used in the opening portion formation step shown in FIG. 4A has an etching opening portion Ma that substantively coincides with the opening end 32 of the through hole 30A in the projection view in the thickness direction D.

Figure 8:
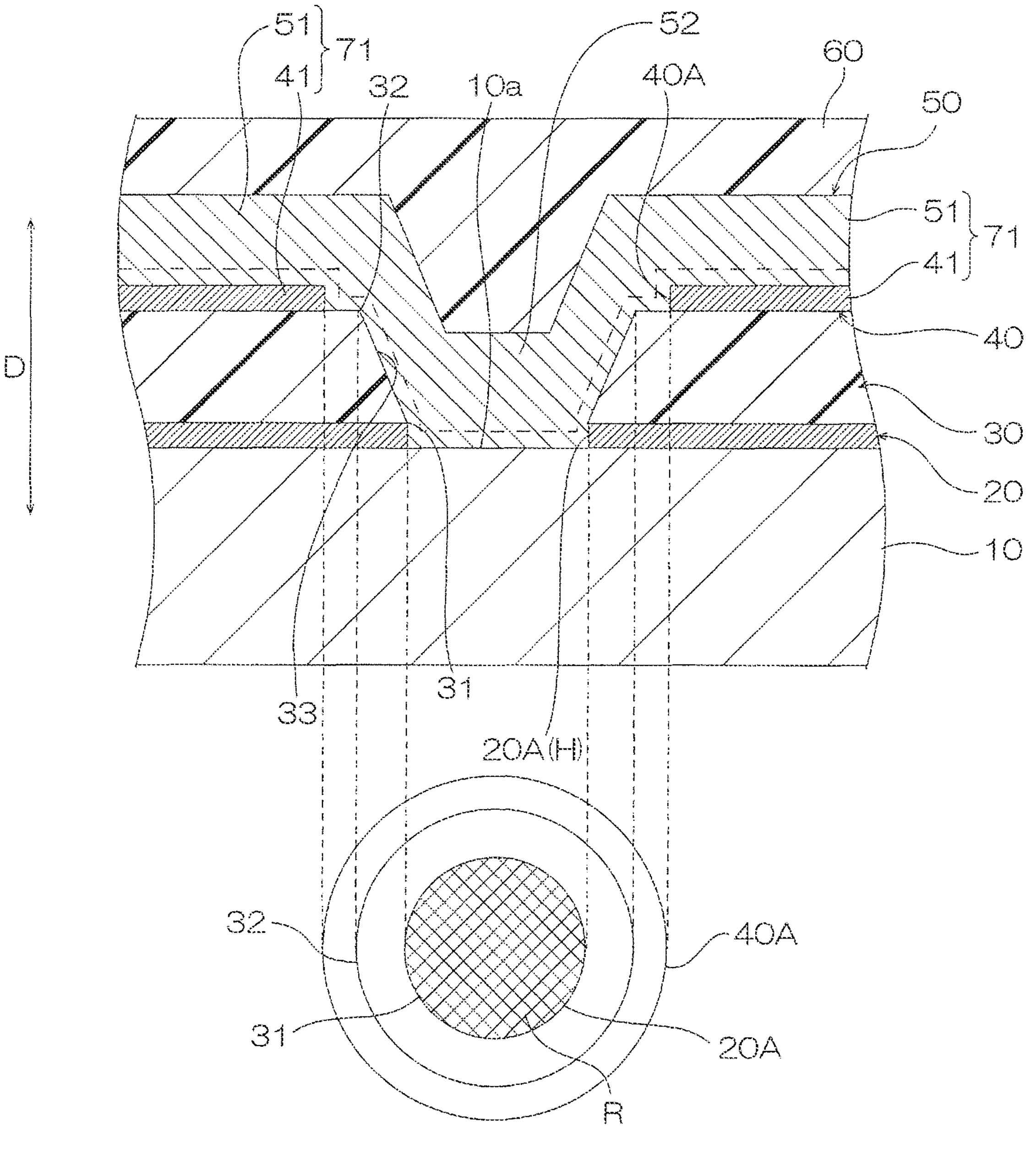
FIG. 8 is an enlarged partial cross-sectional view of the third variation of the wiring circuit board of FIG. 1.

In the wiring circuit board X as shown in FIG. 8, the opening portion 40A of the metal thin film 40 may be open on the insulating layer 30, the opening end 32 may be disposed in the opening portion 40A in a projection view in the thickness direction D, and the opening portion 20A of the metal thin film 20 may be open along the opening end 31 of the through hole 30A in the metal support board 10. In such a case, the metal thin film 40 does not include the metal thin film 42 in the through hole 30A.

The schematic view under the cross-sectional view in FIG. 8 shows the positional relationship between the opening portion 20A of the metal thin film 20, the opening ends 31 and 32 of the through hole 30A, and the opening portion 40A of the metal thin film 40 in the projection view of the variation, i.e., the third variation of the wiring circuit board X in the thickness direction D. In the projection view in the thickness direction D, the opening portion 20A overlaps the opening end 31 while the opening portion 40A overlaps the opening portion 20A and the opening end 32. In the present variation, the opening portion 20A and the opening end 31 substantively coincide with each other in the projection view in the thickness direction D.

The third variation is produced in the same manner as the production method described above except for the following. The etching mask M used in the opening portion formation step as shown in FIG. 4A includes an etching opening portion Ma having a larger diameter than the opening end 32 of the through hole 30A in a projection view in the thickness direction D and including the opening end 32.

Figure 9:
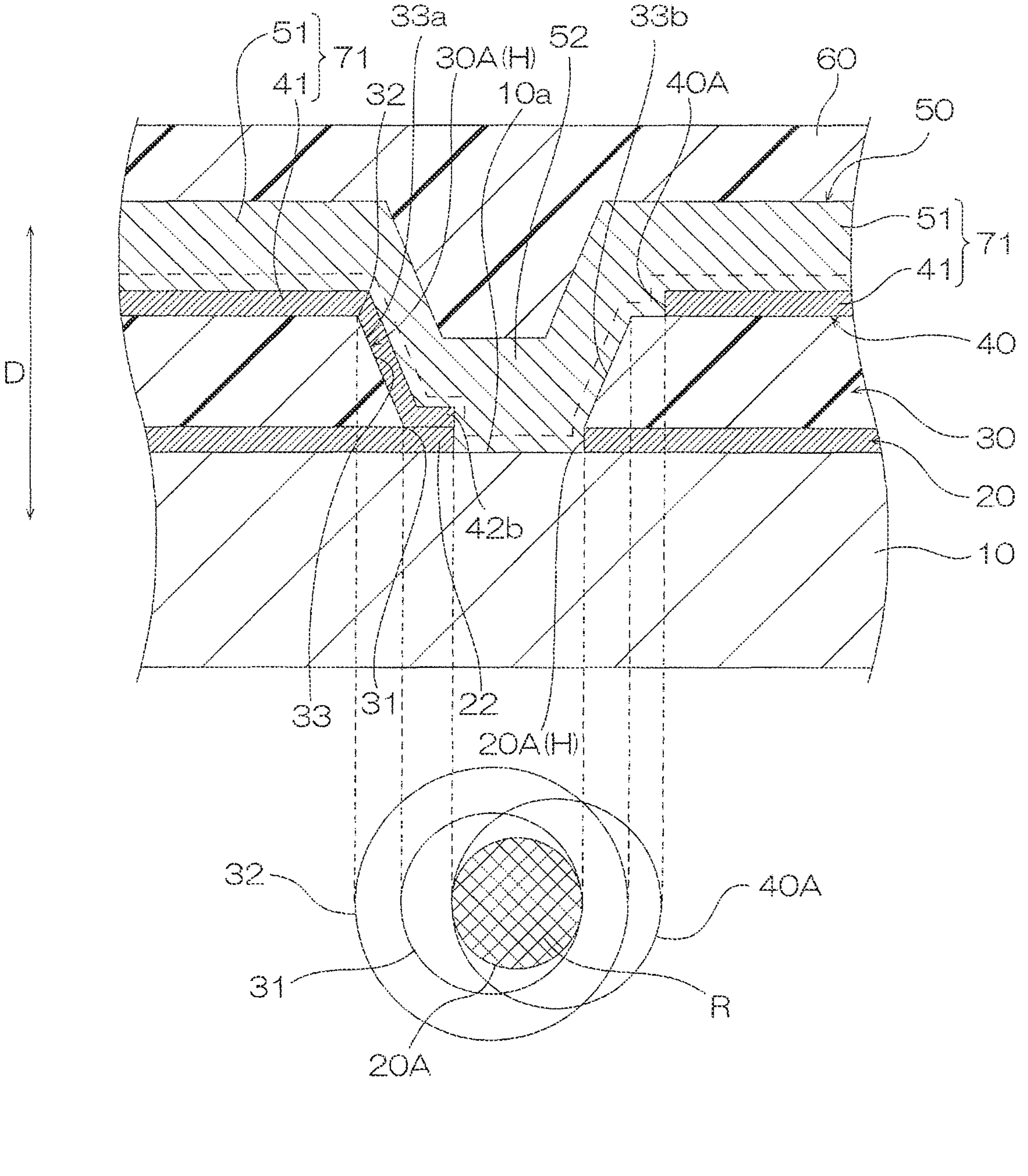
FIG. 9 is an enlarged partial cross-sectional view of the fourth variation of the wiring circuit board of FIG. 1.

In the wiring circuit board X as shown in FIG. 9, the opening portion 40A of the metal thin film 40 may be formed to partially overlap the opening ends 31 and 32 of the through hole 30A of the insulating layers 30 in a projection view in the thickness direction D. In such a case, the inner wall surface 33 of the through hole 30A includes a portion 33*a* that is covered with the metal thin film 40 and a portion 33*b* that is not covered with the metal thin film 40.

The schematic view under the cross-sectional view in FIG. 9 shows the positional relationship between the opening portion 20A of the metal thin film 20, the opening ends 31 and 32 of the through hole 30A, and the opening portion 40A of the metal thin film 40 in the projection view of the variation, i.e., the fourth variation of the wiring circuit board X in the thickness direction D. In the projection view in the thickness direction D, the opening portion 20A overlaps the opening end 31 while the opening portion 40A overlaps the opening portion 20A and the opening end 32.

The fourth variation is produced in the same manner as the production method described above except for the following. The etching mask M used in the opening portion formation step as shown in FIG. 4A includes an etching opening portion Ma that partially overlaps the opening ends 31 and 32 of the through hole 30A in the projection view in the thickness direction D.

Figure 10:
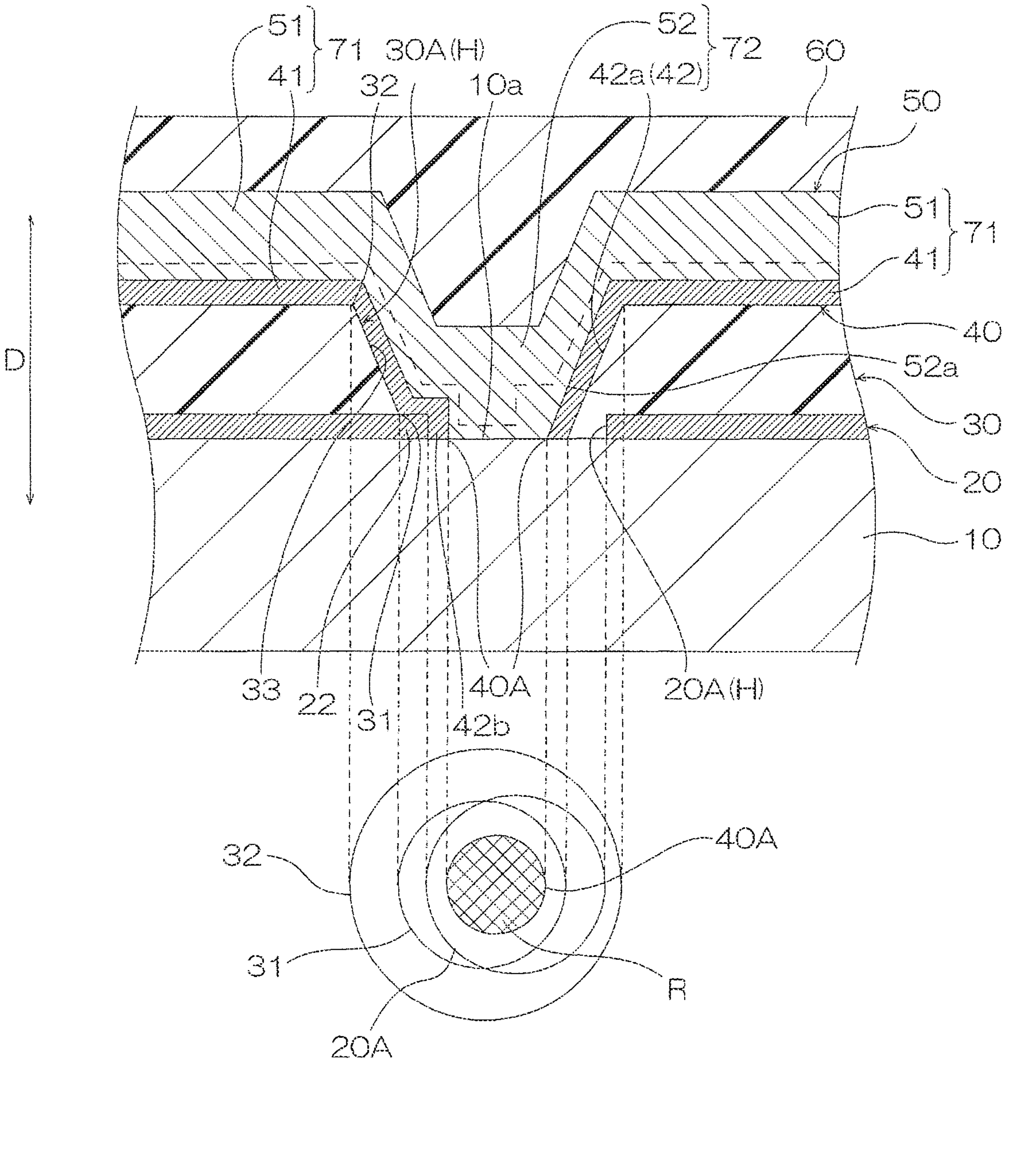
FIG. 10 is an enlarged partial cross-sectional view of the fifth variation of the wiring circuit board of FIG. 1.

In the wiring circuit board X as shown in FIG. 10, the opening portion 20A of the metal thin film 20 is formed to partially overlap the opening end 31 of the through hole 30A of the insulating layer 30 in the projection view in the thickness direction D.

The schematic view under the cross-sectional view in FIG. 10 shows the positional relationship between the opening portion 20A of the metal thin film 20, the opening ends 31 and 32 of the through hole 30A, and the opening portion 40A of the metal thin film 40 in the projection view of the variation, i.e., the fifth variation of the wiring circuit board X in the thickness direction D. In the projection view in the thickness direction D, the opening portion 20A overlaps the opening end 31 while the opening portion 40A overlaps the opening portion 20A and the opening end 32.

The fifth variation is produced in the same manner as the production method described above except for the following: the opening portion 20A of the metal thin film 20 is formed after the first metal thin film formation step shown in FIG. 3B; and the opening portion 20A is formed at a position where the opening portion 20A partially overlaps the through hole 30A of the insulating layer 30 in the insulating base layer formation step shown in FIG. 3C. The opening portion 20A is formed by, for example, the same method as the opening portion formation step shown in FIG.

4A. Further, the etching mask M used in the opening portion formation step shown in FIG. 4A includes, in the opening end 31, an etching opening portion Ma with a smaller diameter than the opening end 31 of the through hole 30A in the projection view in the thickness direction D.

Figure 11:
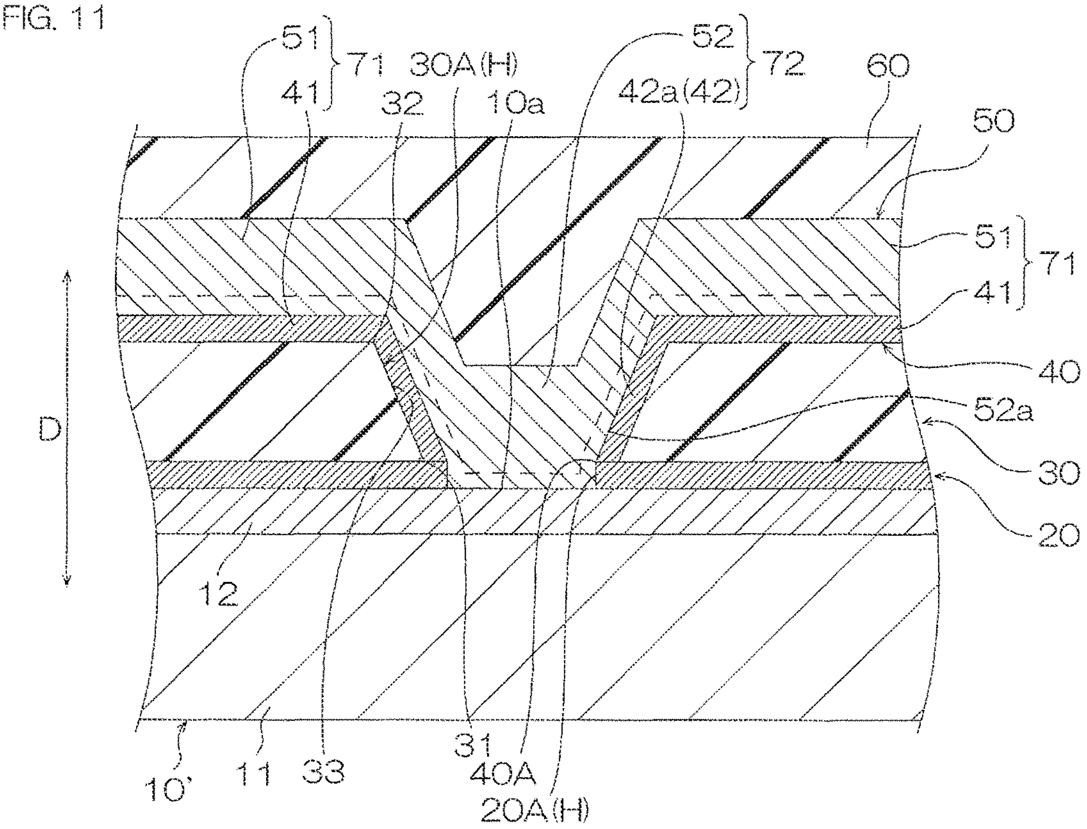
FIG. 11 is an enlarged partial cross-sectional view of the sixth variation of the wiring circuit board of FIG. 1.

As shown in FIG. 11, the wiring circuit board X may include a metal support board 10' instead of the metal support board 10. The metal support board 10' includes a metal support layer 11 and a surface metal layer 12 disposed at the insulating layer 30 side of the metal support layer 11.

The metal support layer 11 is a substrate for ensuring the strength of the wiring circuit board X. Examples of the material of the metal support layer 11 include the materials exemplifying the material of the metal support board 10. In view of the strength of the metal support layer 11, the metal support layer 11 preferably contains at least one selected from the group consisting of a stainless steel, a copper alloy, aluminum, nickel, and titanium, and more preferably consists of at least one selected from the group consisting of a stainless steel, a copper alloy, aluminum, nickel, and titanium. In view of the simultaneous achievement of the strength and conductivity of the metal support layer 11, the metal support layer 11 preferably consists of a copper alloy. The metal support layer 11 has a thickness of, for example, 15 μm or more. The thickness of the metal support layer 11 is, for example, 500 μm or less, preferably 250 μm or less.

The surface metal layer 12 is disposed on a one-side surface in the thickness direction D of the metal support layer 11. The surface metal layer 12 is in contact with the metal support layer 11. In the present embodiment, the surface metal layer 12 is disposed on the whole of the one-side surface in the thickness direction D of the metal support layer 11. Examples of the surface metal layer 12 include sputtering films, plating films, and vacuum-deposited films. The surface metal layer 12 has a higher conductivity than the metal support layer 11. In view of the conductivity of the surface metal layer 12, the surface metal layer 12 preferably contains at least one selected from the group consisting of gold, silver, and copper, and more preferably consists of at least one selected from the group consisting of gold, silver, and copper. In view of the film formability of the surface metal layer 12 when the metal support layer 11 is a copper alloy, the surface metal layer 12 preferably consists of copper. The thickness of the surface metal layer 12 is preferably 0.5 μm or more, more preferably 3 μm or more.

In the present variation, i.e., the sixth variation, the via portion 52 of the conductive layer 50 is connected to the surface metal layer 12 of the metal support board 10'.

The sixth variation is produced in the same manner as the production method described above except that the metal support board 10' is prepared instead of the metal support board 10 in the preparation step.

In the sixth variation as described above, the via portion 52 is connected to the surface metal layer 12 with a higher conductivity than the metal support layer 11 in the metal support board 10'. Such a structure is preferable for achieving the low-resistance electrical connection between the metal support board 10' and the wiring layer 71.

Figure 12:
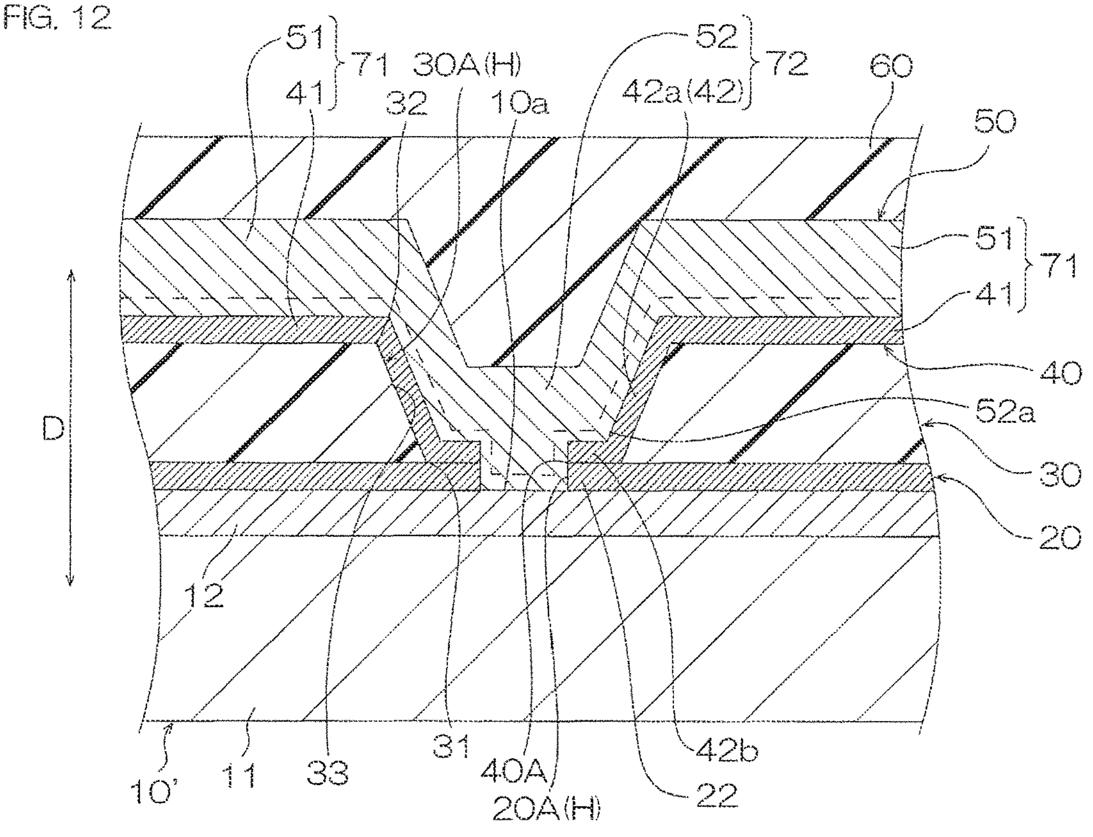
FIG. 12 is an enlarged partial cross-sectional view of the seventh variation of the wiring circuit board of FIG. 1.
Figure 13:
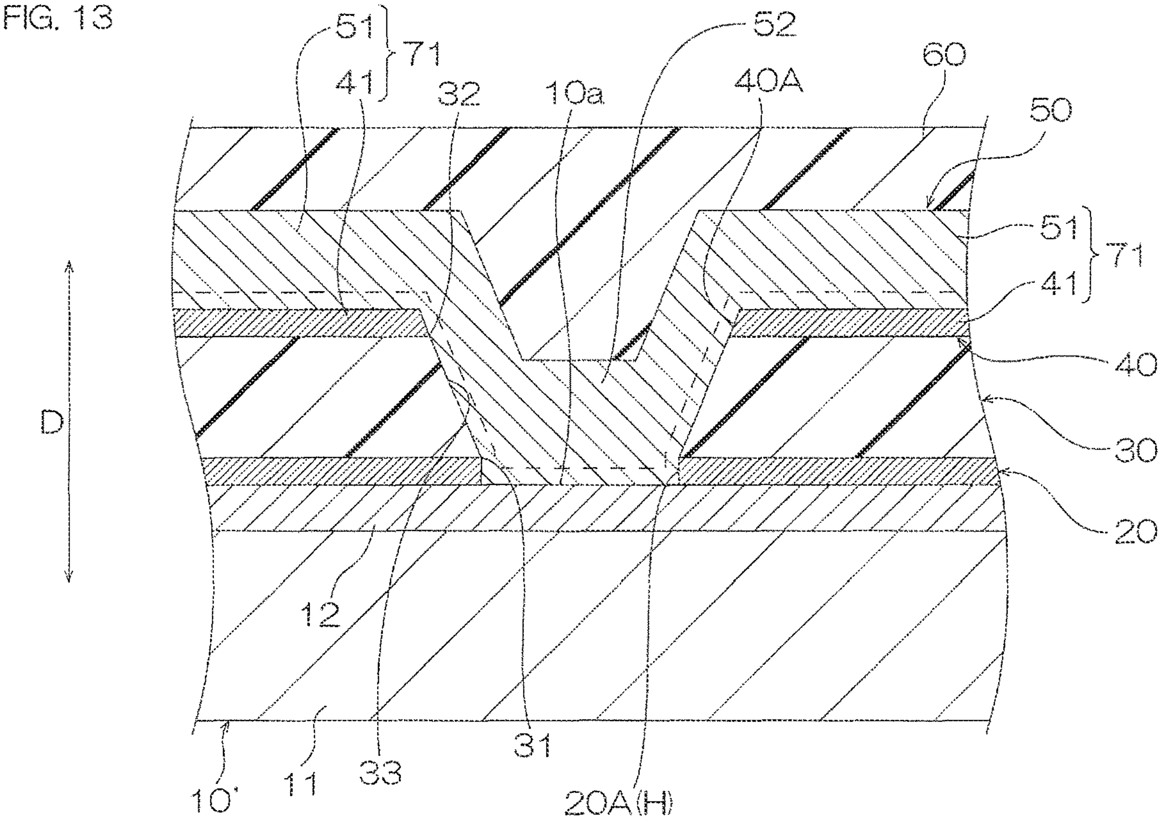
FIG. 13 is an enlarged partial cross-sectional view of the eighth variation of the wiring circuit board of FIG. 1.
Figure 14:
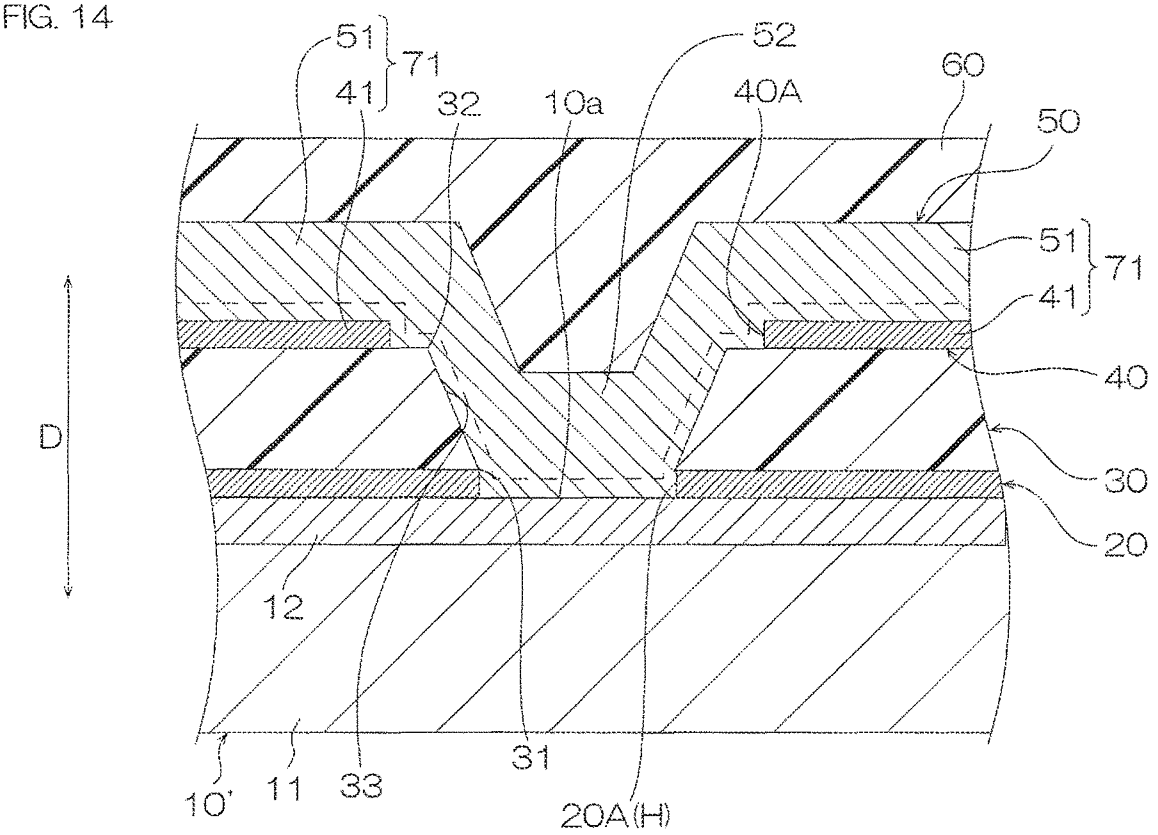
FIG. 14 is an enlarged partial cross-sectional view of the ninth variation of the wiring circuit board of FIG. 1.
Figure 15:
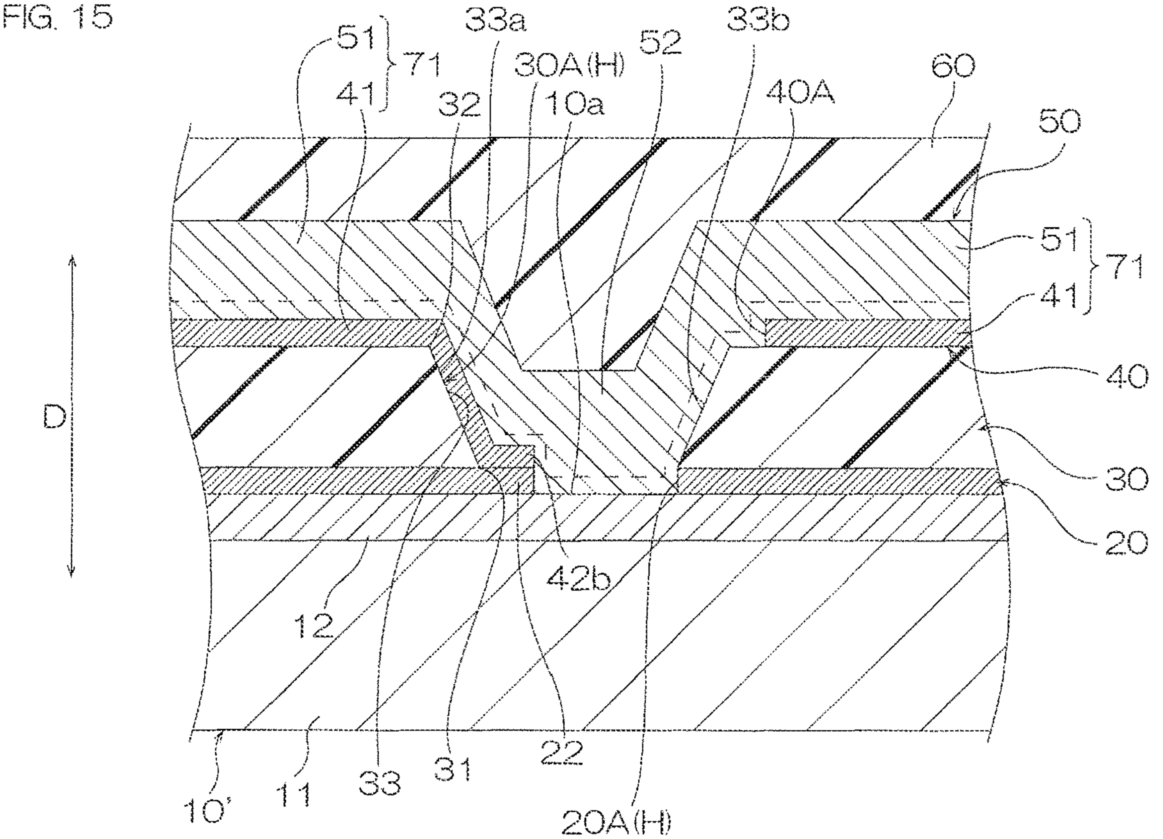
FIG. 15 is an enlarged partial cross-sectional view of the tenth variation of the wiring circuit board of FIG. 1.
Figure 16:
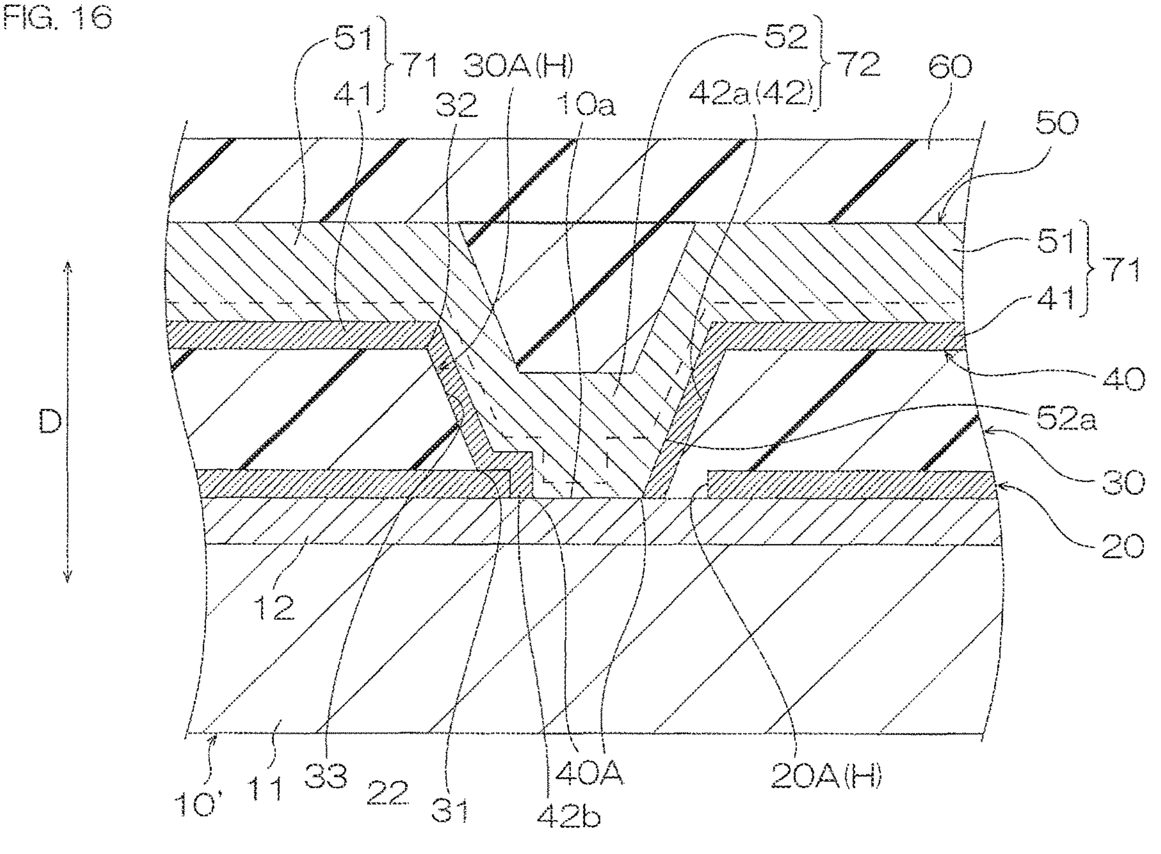
FIG. 16 is an enlarged partial cross-sectional view of the eleventh variation of the wiring circuit board of FIG. 1.

FIG. 12 shows the seventh variation in which the metal support board 10 of the first variation is replaced with the metal support board 10'. FIG. 13 shows the eighth variation in which the metal support board 10 of the second variation is replaced with the metal support board 10'. FIG. 14 shows the ninth variation in which the metal support board 10 of the third variation is replaced with the metal support board 10'. FIG. 15 shows the tenth variation in which the metal support board 10 of the fourth variation is replaced with the metal support board 10'. FIG. 16 shows the eleventh variation in which the metal support board 10 of the fifth variation is replaced with the metal support board 10'.

Figure 17:
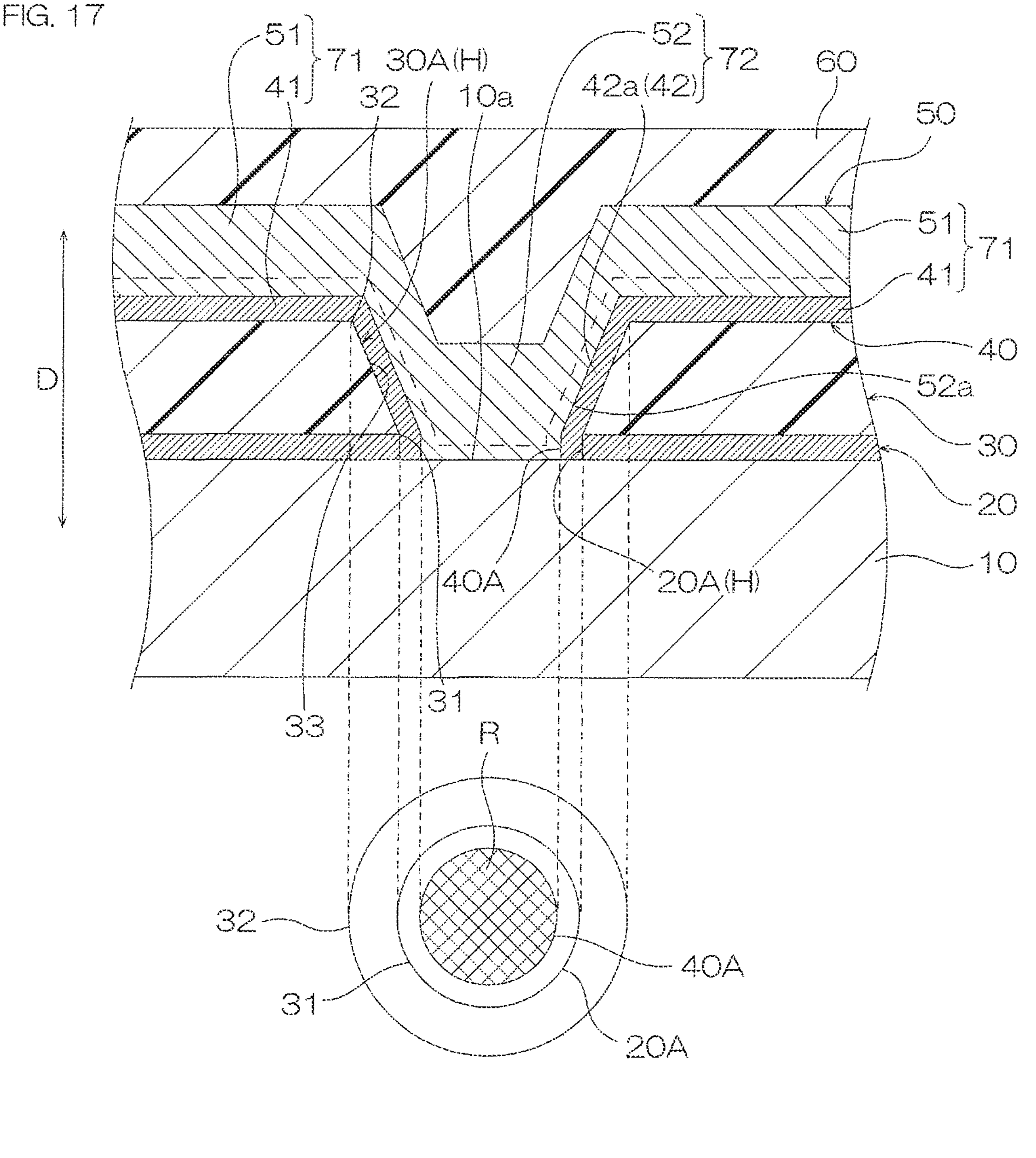
FIG. 17 is an enlarged partial cross-sectional view of the twelfth variation of the wiring circuit board of FIG. 1.

In the wiring circuit board X, as shown in FIG. 17, the metal thin film 40 may be in contact with the metal support board 10 in the through hole H while the opening portion 40A of the metal thin film 40 may be open along the opening portion 20A of the metal thin film 20 on the metal support board 10. In a projection view of this wiring circuit board X in the thickness direction D, the opening portion 20A of the metal thin film 20 overlaps the opening end 31 of the through hole 30A of the insulating layer 30 while the opening portion 40A of the metal thin film 40 overlaps the opening portion 20A and the opening end 32 of the through hole 30A. In the projection view of this variation, i.e., the twelfth variation in the thickness direction D, the opening portion 20A and the opening end 31 substantively coincide with each other.

FIGS. 18A to 18C, FIGS. 19A to 19C, and FIGS. 20A to 20C show a method of producing the twelfth variation of the wiring circuit board X shown in FIG. 17 as another embodiment of the method of producing the wiring circuit board of the present invention.

Figure 18A:
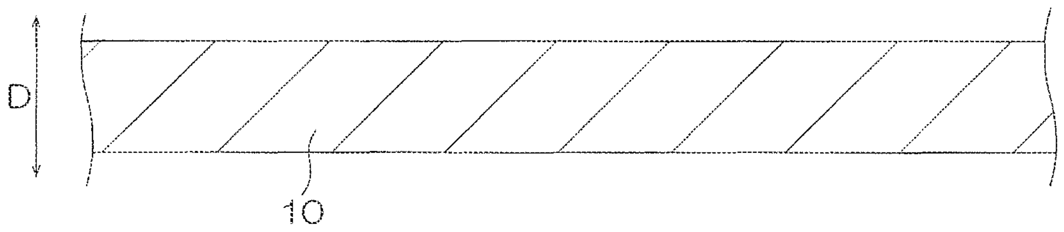
FIGS. 18A to 18C illustrate some steps of another embodiment of the method of producing the wiring circuit board of the present invention.

In the present production method, first, the metal support board 10 is prepared as shown in FIG. 18A (preparation step).

Figure 18B:
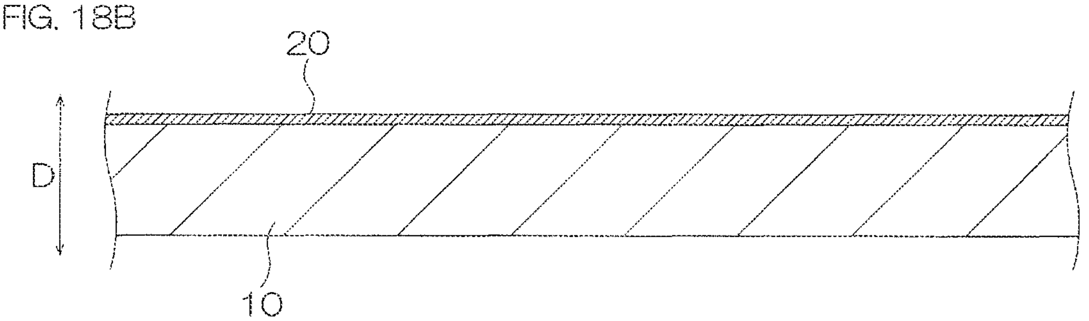

Next, as shown in FIG. 18B, the metal thin film 20 is formed on the one-side surface in the thickness direction D of the metal support board 10 (first metal thin film formation step). The details of the formation are the same as described above with reference to FIG. 3B.

Figure 18C:
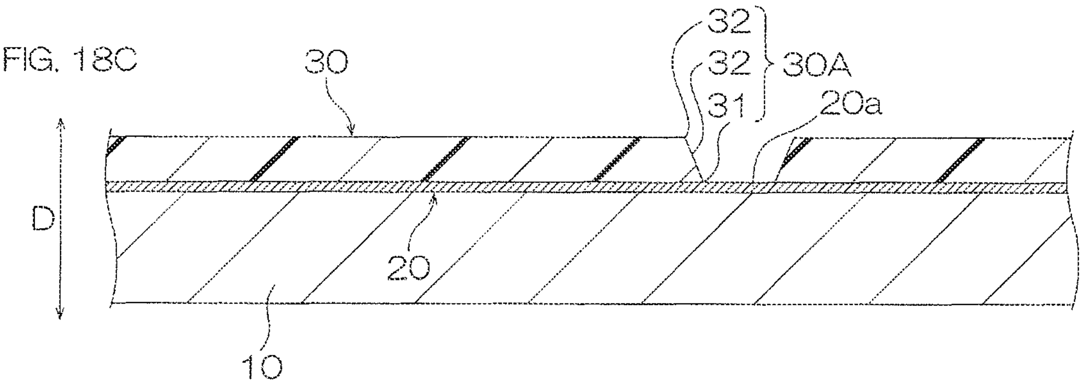

Next, as shown in FIG. 18C, the insulating layer 30 is formed on the one-side surface in the thickness direction D of the metal thin film 20 (insulating base layer formation step). The details of the formation are the same as described above with reference to FIG. 3C.

Figure 19A:
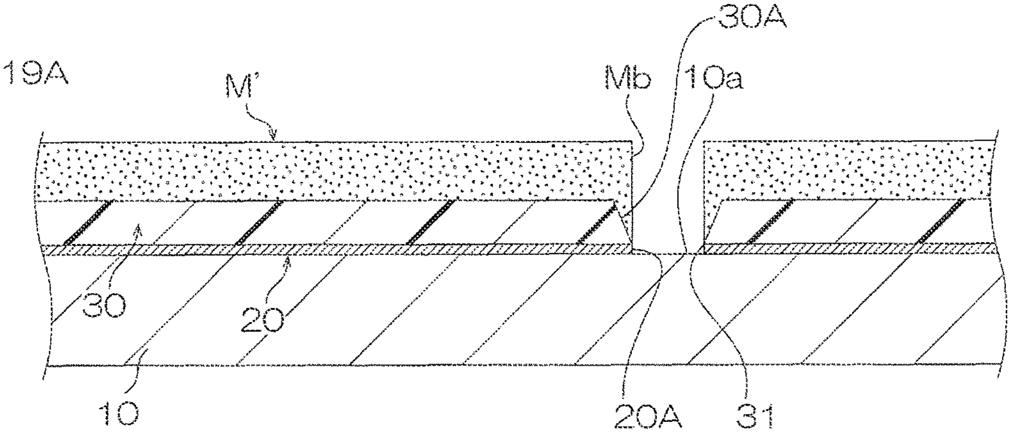
FIGS. 19A to 19C illustrate the steps subsequent to the step of FIG. 18C.

Next, as shown in FIG. 19A, the opening portion 20A is formed in the metal thin film 20 (first opening portion formation step). The details of the formation are, for example, as follows.

First, an etching mask M' is formed on the insulating layer 30. The etching mask M' includes an etching opening portion Mb. In a plan view, the etching opening portion Mb has a shape corresponding to the shape of the opening end 31 of the through hole 30A of the insulating layer 30. For the formation of the etching mask M', first, a photosensitive resist film is bonded onto the insulating layer 30 to form a resist film. Next, the resist film is subjected to an exposure process through a predetermined mask and subsequently a development process. If needed, a baking process follows the development process. In this manner, the etching opening portion Mb corresponding to the opening portion 20A to be formed on the metal thin film 20 is formed.

In this step, next, the metal thin film 20 is subjected to an etching process through the etching mask M' on the insulating layer 30. This etching process removes the part of the metal thin film 20 facing the etching opening portion Mb. In this manner, the opening portion 20A is formed. Thereafter, the etching mask M' on the insulating layer 30 is removed. Examples of the etching process include wet etching and dry etching. Wet etching is preferred. The etching solution and etching conditions for the etching process are the same as those of the etching process described above with reference to FIG. 4A.

In this step, the opening portion 20A is formed on the metal thin film 20 as described above. The opening portion 20A overlaps and substantively coincides with the opening end 31 of the through hole 30A in a projection view in the thickness direction D. By this step, the metal support board 10 is exposed at the through hole 30A.

Figure 19B:
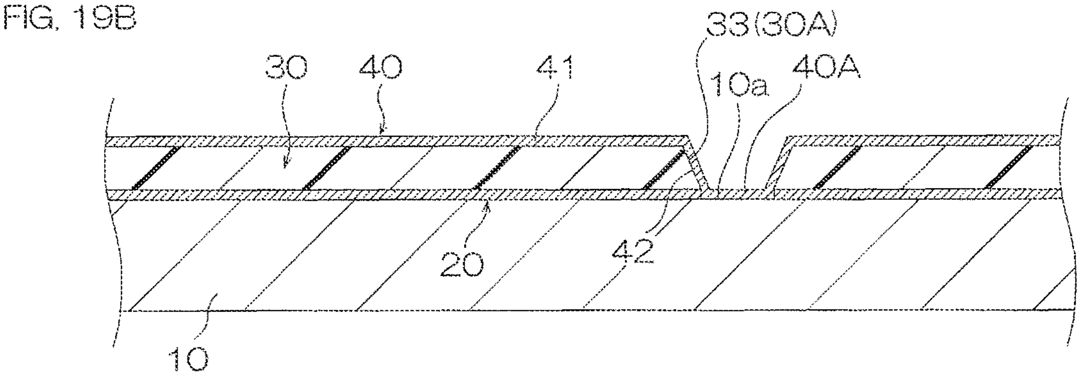

Next, as shown in FIG. 19B, the metal thin film 40 is formed as a seed layer (second metal thin film formation step). In this step, the metal thin film 40 is formed continuously on the one-side surface in the thickness direction D of the insulating layer 30, on the inner wall surface 33 of the through hole 30A, and on the portion 10*a* of the metal support board 10 exposed at the through hole 30A. The metal thin film 40 includes the metal thin film 41 outside the through hole 30A and the metal thin film 42 inside the through hole 30A. The method of forming the metal thin film 40 is the same as described with reference to FIG. 3D.

Figure 19C:
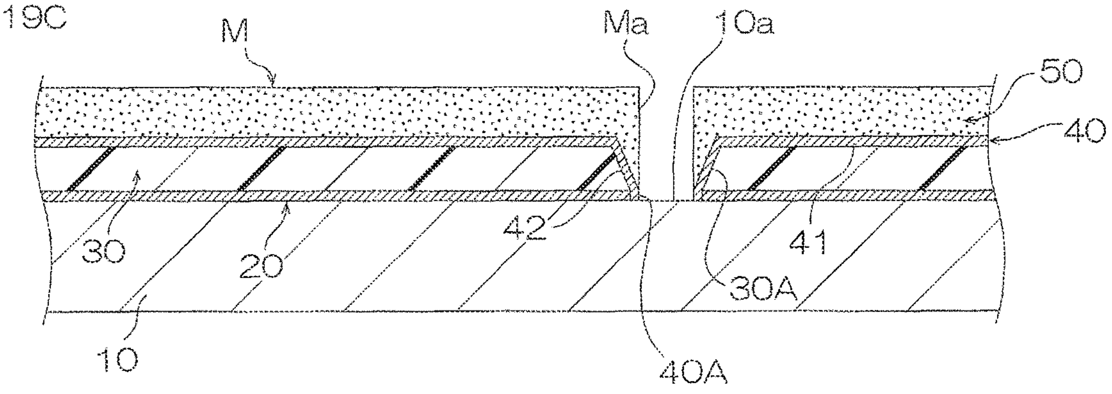

Next, as shown in FIG. 19C, the opening portion 40A is formed on the metal thin film 40 (second opening portion formation step). The details of the formation is the same as described with reference to FIG. 4A. In this step, the opening portion 40A open along the opening portion 20A on the metal support board 10 is formed, thereby exposing the metal support board 10 at the through hole 30A. The opening portions 20A and 40A overlap the opening ends 31 and 32 of the through hole 30A in a projection view in the thickness direction D.

Figure 20A:
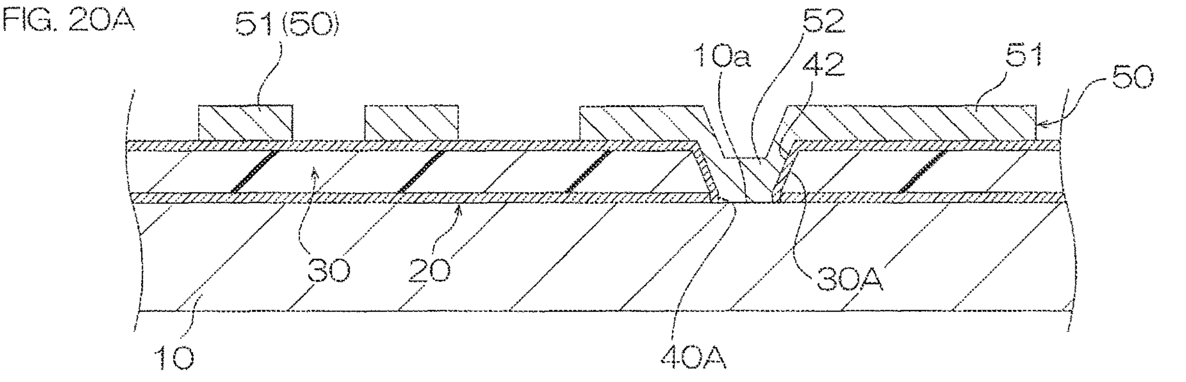
FIGS. 20A to 20C illustrate the steps subsequent to the step of FIG. 19C.

Next, as shown in FIG. 20A, the conductive layer 50 including the wiring portion 51 and the via portion 52 is formed throughout on the one-side surface in the thickness direction D of the metal thin film 40 and the metal support board 10 in the through hole 30A (conductive layer formation step). The details of the formation are the same as described with reference to FIG. 4B.

Figure 20B:
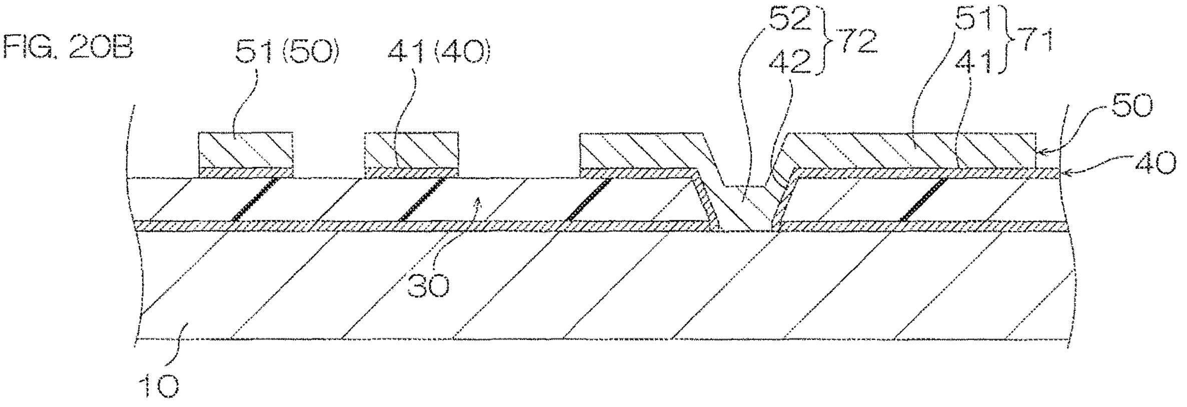

Next, as shown in FIG. 20B, the part of the metal thin film 40 that is not covered with the conductive layer 50 is removed by etching (etching step). The details of the formation are the same as described with reference to FIG. 4C. By this step, the wiring layer 71 (the wiring portion 51 and the metal thin film 41) and the via 72 (the via portion 52 and the metal thin film 42) are formed.

Figure 20C:
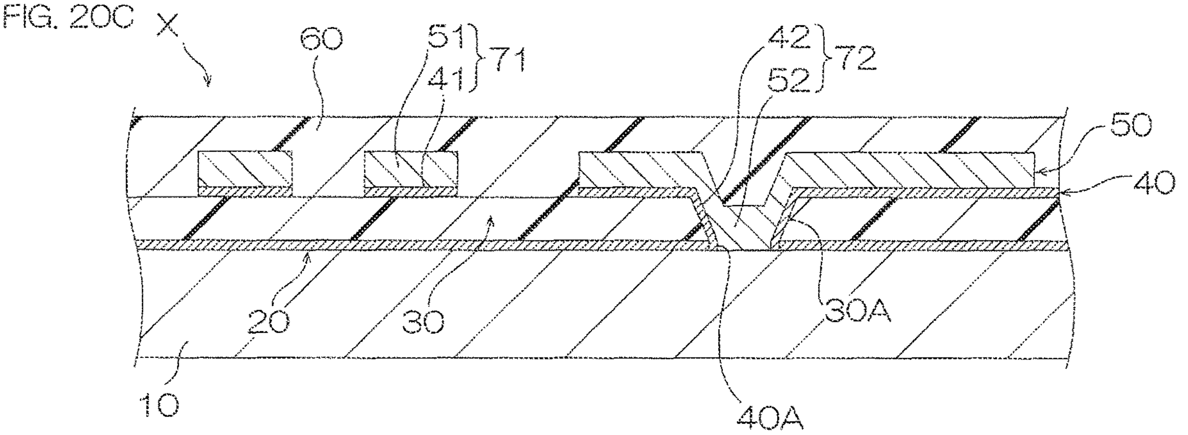

Next, as shown in FIG. 20C, the insulating layer 60 is formed on the insulating layer 30 to cover the wiring layer 71 and the via 72 (insulating cover layer formation step). The details of the formation are the same as described with reference to FIG. 4D.

As described above, the twelfth variation of the wiring circuit board X is produced.

In the insulating base layer formation step of the present production method as shown in FIG. 18C, a surface of the portion 20*a* of the metal thin film 20 facing the through hole 30A is oxidized. However, in the subsequent first opening portion formation step shown in FIG. 19A, the portion 20*a* of the metal thin film 20 is removed. Further, in the second metal thin film formation step shown in FIG. 19B, the metal thin film 40 is formed as a seed layer continuously on the insulating layer 30 and on the portion 10*a* of the metal support board 10. As the material of the metal thin film 40, chromium is preferably used as described above. Chromium has a higher resistance than, for example, copper and is a conductor with a relatively high resistance. However, in the subsequent second opening portion formation step as shown in FIG. 19C, the portion 40*a* of the metal thin film 40 is removed. In this manner, a part, i.e., the portion 10*a* of the metal support board 10 is exposed. Consequentially, the via portion 52 formed in the conductive layer formation step as shown in FIG. 20A is directly connected to the portion 10*a* of the metal support board 10.

As described above, the present production method allows the formation of the wiring circuit board X where the via portion 52 is directly connected to the metal support board 10. This means that the metal thin films 20 and 40 do not intervene in the electrical connection between the via portion 52 and the metal support board 10. Thus, the present production method is suitable for achieving the low-resistance electrical connection between the metal support board 10 and the wiring layer 71 in the wiring circuit board X.

After the second opening portion formation step as shown in FIG. 19C in the present production method, the conductive layer formation step described with reference to FIG. 5A and FIG. 5B and subsequently the etching step described with reference to FIG. 5C may be carried out instead of the conductive layer formation step as shown in FIG. 20A and the etching step as shown in FIG. 20B. This method allows the formation of the conductive layer 50 having a laminate structure including the conductive thin film 50*a* and the conductive layer 50*b* as described above with reference to FIGS. 5A to 5C.

Figure 21:
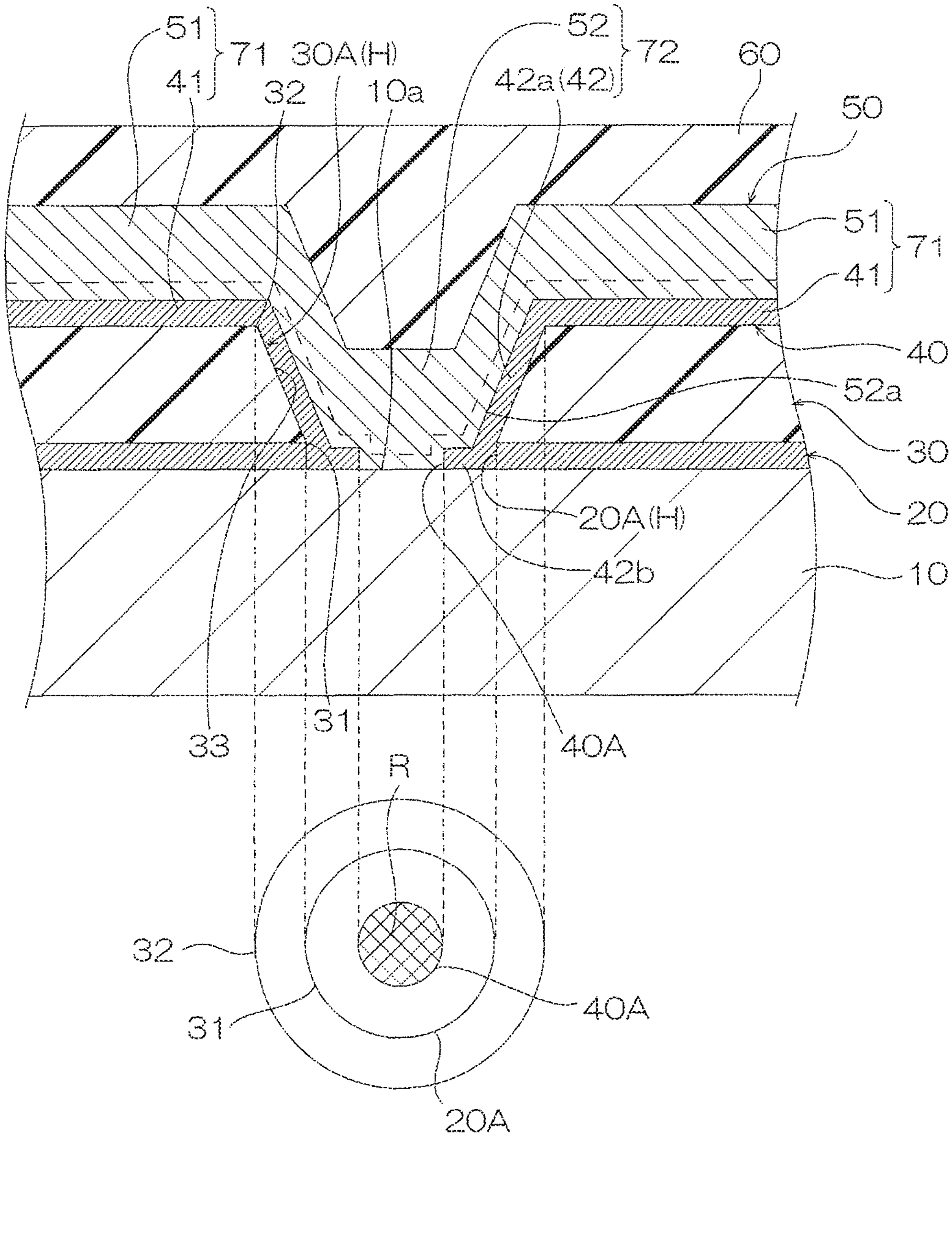
FIG. 21 is an enlarged partial cross-sectional view of the thirteenth variation of the wiring circuit board of FIG. 1.

In the wiring circuit board X, as shown in FIG. 21, the metal thin film 40 may include a covering portion 42*b* that is in contact with and covers the metal support board 10 in the through hole H. The covering portion 42*b* protrudes into the opening end 31 of the through hole 30A to define the opening portion 40A in a projection view in the thickness direction D. The opening portion 40A is disposed inside the opening portion 20A of the metal thin film 20.

The schematic view under the cross-sectional view in FIG. 21 shows the positional relationship between the opening portion 20A of the metal thin film 20, the opening ends 31 and 32 of the through hole 30A, and the opening portion 40A of the metal thin film 40 in the projection view of the thirteenth variation of the wiring circuit board X in the thickness direction D. In the projection view in the thickness direction D, the opening portion 20A overlaps the opening end 31 while the opening portion 40A overlaps the opening portion 20A and the opening end 32. In the projection view of the present variation in the thickness direction D, the opening portion 20A and the opening end 31 substantively coincide with each other and the opening portion 40A is disposed in the opening end 31.

The thirteenth variation is produced in the same manner as the production method of the twelfth variation shown in FIGS. 18A to 20C except for the following. The etching mask M used in the second opening portion formation step shown in FIG. 19C includes, in the opening end 31, an etching opening portion Ma with a smaller diameter than the opening end 31 of the through hole 30A in the projection view in the thickness direction D.

Figure 22:
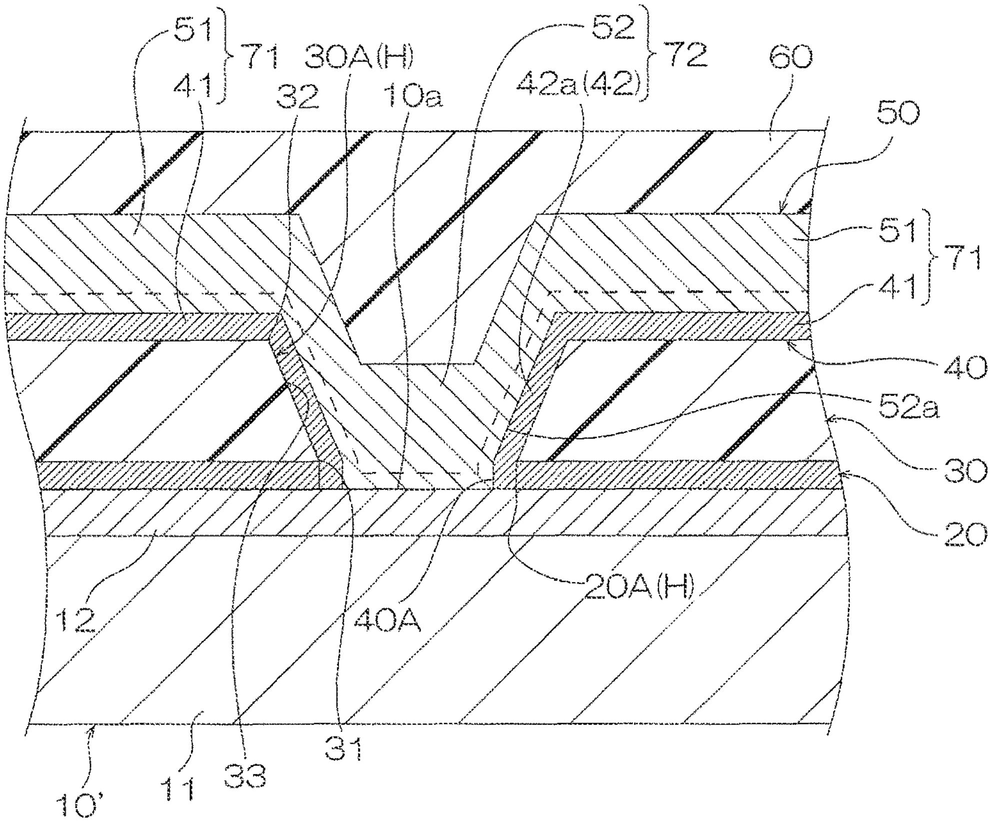
FIG. 22 is an enlarged partial cross-sectional view of the fourteenth variation of the wiring circuit board of FIG. 1.

FIG. 22 shows the fourteenth variation in which the metal support board 10 of the twelfth variation is replaced with the metal support board 10'. The fourteenth variation is produced in the same method as the twelfth variation except that the metal support board 10' is prepared instead of the metal support board 10 in the preparation step.

Figure 23:
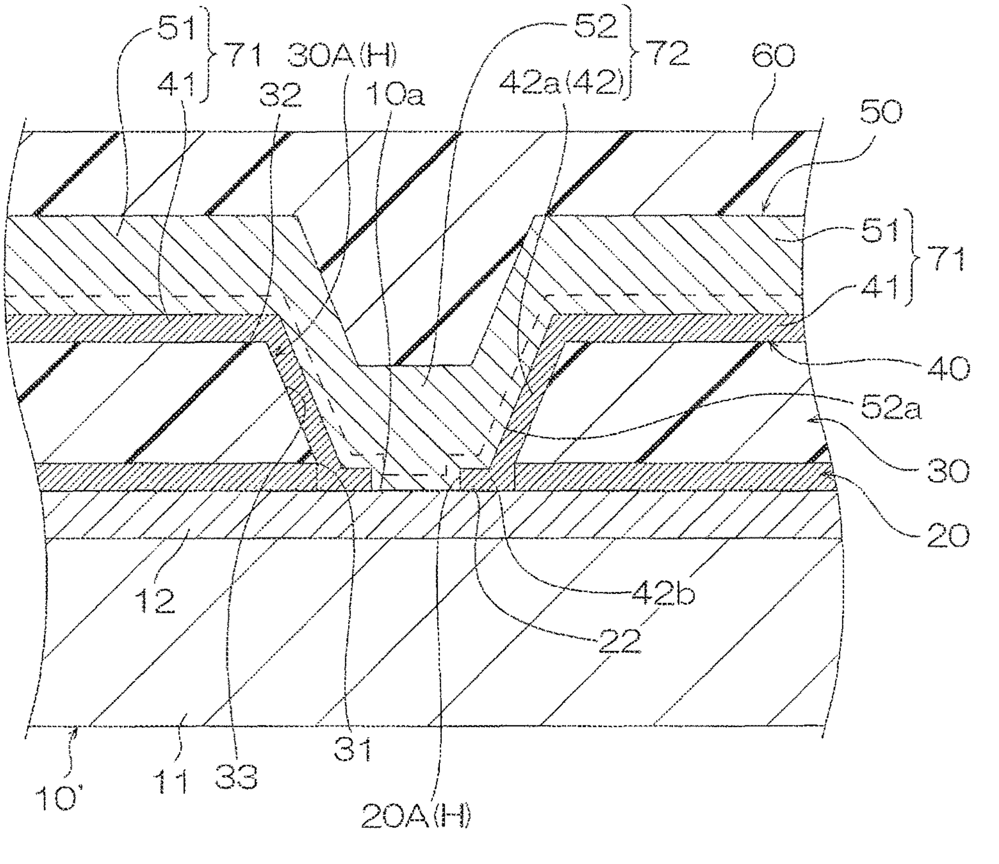
FIG. 23 is an enlarged partial cross-sectional view of the fifteenth variation of the wiring circuit board of FIG. 1.

FIG. 23 shows the fifteenth variation in which the metal support board 10 of the thirteenth variation is replaced with the metal support board 10'. The fifteenth variation is produced in the same method as the thirteenth variation except that the metal support board 10' is prepared instead of the metal support board 10 in the preparation step.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

DESCRIPTION OF REFERENCE NUMERALS

X wiring circuit board
D thickness direction
10 metal support board
10*a* portion
11 metal support layer
12 surface metal layer
20 metal thin film (first metal thin film)
20A opening portion (first opening portion)
20*a* portion
30 insulating layer
30A, H through hole
31 opening end (first opening end)
32 opening end (second opening end)
33 inner wall surface
40 metal thin film (second metal thin film)
40A opening portion (second opening portion)
40*a* portion
50 conductive layer
51 wiring portion
52 via portion
60 insulating layer
71 wiring layer
72 via

The invention claimed is:

1. A wiring circuit board comprising:

a metal support board, a first metal thin film, an insulating layer, a second metal thin film, and a conductive layer in this order in a thickness direction, wherein the insulating layer has a through hole penetrating the insulating layer in the thickness direction, the through hole has a first opening end at the first metal thin film side, a second opening end opposite to the first opening end, and an inner wall surface between the first and second opening ends, the first metal thin film has a first opening portion, the first opening portion overlaps the first opening end in a projection view in the thickness direction, the second metal thin film is disposed at least between a one-side surface in the thickness direction of the insulating layer and the conductive layer, includes a layer consisting of a conductor having a higher resistance than the conductive layer, and has a second opening portion, the second opening portion overlaps the first opening portion and the second opening end in a projection view in the thickness direction, and the conductive layer has a via portion disposed in the through hole and connected to the metal support board.

2. The wiring circuit board according to claim 1, wherein the first opening portion is open along the first opening end.

3. The wiring circuit board according to claim 2, wherein the second opening portion is open along the second opening end on the insulating layer.

4. The wiring circuit board according to claim 1, wherein the second opening portion is open along the second opening end on the insulating layer.

5. A wiring circuit board comprising:

a metal support board, a first metal thin film, an insulating layer, a second metal thin film, and a conductive layer in this order in a thickness direction, wherein the insulating layer has a through hole penetrating the insulating layer in the thickness direction, the through hole has a first opening end at the first metal thin film side, a second opening end opposite to the first opening end, and an inner wall surface between the first and second opening ends, the first metal thin film has a first opening portion, the first opening portion overlaps the first opening end in a projection view in the thickness direction, the second metal thin film has a second opening portion, the second opening portion overlaps the first opening portion and the second opening end in a projection view in the thickness direction, the conductive layer has a via portion disposed in the through hole and connected to the metal support board, the metal support board includes a metal support layer and a surface metal layer disposed at the insulating layer side of the metal support layer and having a higher conductivity than the metal support layer, and the via portion is connected to the surface metal layer.

6. The wiring circuit board according to claim 5, wherein the first opening portion is open along the first opening end.

7. The wiring circuit board according to claim 5, wherein the second metal thin film has a first covering portion on the inner wall surface.

8. The wiring circuit board according to claim 7, wherein the second opening portion is open along the first opening portion on the metal support board.

9. The wiring circuit board according to claim 7, wherein the second metal thin film has a second covering portion on the metal support board, and the second opening portion is disposed inside the first opening portion on the metal support board.

10. The wiring circuit board according to claim 5, wherein the second opening portion is open along the second opening end on the insulating layer.

11. The wiring circuit board according to claim 5, wherein the second opening portion is open on the insulating layer, and the second opening end is disposed within the second opening portion in a projection view in the thickness direction.

12. A wiring circuit board comprising:

a metal support board, a first metal thin film, an insulating layer, a second metal thin film, and a conductive layer in this order in a thickness direction, wherein the insulating layer has a through hole penetrating the insulating layer in the thickness direction, the through hole has a first opening end at the first metal thin film side, a second opening end opposite to the first opening end, and an inner wall surface between the first and second opening ends, the first metal thin film has a first opening portion, the first opening portion overlaps the first opening end in a projection view in the thickness direction, the second metal thin film has a second opening portion, the second opening portion overlaps the first opening portion and the second opening end in a projection view in the thickness direction, the conductive layer has a via portion disposed in the through hole and connected to the metal support board, and the second metal thin film has a first covering portion on the inner wall surface.

13. The wiring circuit board according to claim 12, wherein the second opening portion is open along the first opening portion on the metal support board.

14. The wiring circuit board according to claim 12, wherein the second metal thin film has a second covering portion on the metal support board, and the second opening portion is disposed inside the first opening portion on the metal support board.

15. A wiring circuit board comprising:

a metal support board, a first metal thin film, an insulating layer, a second metal thin film, and a conductive layer in this order in a thickness direction, wherein the insulating layer has a through hole penetrating the insulating layer in the thickness direction, the through hole has a first opening end at the first metal thin film side, a second opening end opposite to the first opening end, and an inner wall surface between the first and second opening ends, the first metal thin film has a first opening portion, the first opening portion overlaps the first opening end in a projection view in the thickness direction, the second metal thin film has a second opening portion, the second opening portion overlaps the first opening portion and the second opening end in a projection view in the thickness direction, the conductive layer has a via portion disposed in the through hole and connected to the metal support board, the first opening portion is open along the first opening end, and the second metal thin film has a first covering portion on the inner wall surface.

16. A wiring circuit board comprising:

a metal support board, a first metal thin film, an insulating layer, a second metal thin film, and a conductive layer in this order in a thickness direction, wherein the insulating layer has a through hole penetrating the insulating layer in the thickness direction, the through hole has a first opening end at the first metal thin film side, a second opening end opposite to the first opening end, and an inner wall surface between the first and second opening ends, the first metal thin film has a first opening portion, the first opening portion overlaps the first opening end in a projection view in the thickness direction, the second metal thin film has a second opening portion, the second opening portion overlaps the first opening portion and the second opening end in a projection view in the thickness direction, the conductive layer has a via portion disposed in the through hole and connected to the metal support board, the second opening portion is open on the insulating layer, and the second opening end is disposed within the second opening portion in a projection view in the thickness direction.

17. A wiring circuit board comprising:

a metal support board, a first metal thin film, an insulating layer, a second metal thin film, and a conductive layer in this order in a thickness direction, wherein the insulating layer has a through hole penetrating the insulating layer in the thickness direction, the through hole has a first opening end at the first metal thin film side, a second opening end opposite to the first opening end, and an inner wall surface between the first and second opening ends, the first metal thin film has a first opening portion, the first opening portion overlaps the first opening end in a projection view in the thickness direction, the second metal thin film has a second opening portion, the second opening portion overlaps the first opening portion and the second opening end in a projection view in the thickness direction, the conductive layer has a via portion disposed in the through hole and connected to the metal support board, the first opening portion is open along the first opening end, the second opening portion is open on the insulating layer, and the second opening end is disposed within the second opening portion in a projection view in the thickness direction.

18. A wiring circuit board comprising:

a metal support board, a first metal thin film, an insulating layer, a second metal thin film, and a conductive layer in this order in a thickness direction, wherein the insulating layer has a through hole penetrating the insulating layer in the thickness direction, the through hole has a first opening end at the first metal thin film side, a second opening end opposite to the first opening end, and an inner wall surface between the first and second opening ends, the first metal thin film has a first opening portion, the first opening portion overlaps the first opening end in a projection view in the thickness direction, the second metal thin film has a second opening portion, the second opening portion overlaps the first opening portion and the second opening end in a projection view in the thickness direction, the conductive layer has a via portion disposed in the through hole and connected to the metal support board, the first metal thin film includes a protruding portion protruding in the first opening end in a projection view in the thickness direction to define the first opening portion, the second metal thin film includes a first covering portion on the inner wall surface and a second covering portion on the protruding portion, and the second opening portion is open along the first opening portion.

19. A method of producing a wiring circuit board comprising:

a first metal thin film forming step of forming a first metal thin film on a one-side surface in a thickness direction of the metal support board;

an insulating layer forming step of forming an insulating layer on a one-side surface in the thickness direction of the first metal thin film, the insulating layer having a through hole having a first opening end at the first metal thin film side, a second opening end opposite to the first opening end, and an inner wall surface between the first and second opening ends;

a second metal thin film formation step of forming a second metal thin film over a one-side surface in the thickness direction of the insulating layer, the inner wall surface of the through hole, and the first metal thin film in the through hole;

an opening portion formation step of forming an opening portion in the first metal thin film and the second metal thin film, the opening portion overlapping the first opening end and the second opening end in a projection view in the thickness direction, to expose the metal support board at the through hole; and a conductive layer formation step of forming a conductive layer over a one-side surface in the thickness direction of the second metal thin film and the metal support board in the through hole.

20. A method of producing a wiring circuit board comprising:

a first metal thin film forming step of forming a first metal thin film on a one-side surface in a thickness direction of the metal support board;

an insulating layer forming step of forming an insulating layer on a one-side surface in the thickness direction of the first metal thin film, the insulating layer having a through hole having a first opening end at the first metal thin film side, a second opening end opposite to the first opening end, and an inner wall surface between the first and second opening ends;

a first opening portion formation step of forming a first opening portion in the first metal thin film, the first opening portion being open along the first opening end, to expose the metal support board at the through hole;

a second metal thin film formation step of forming a second metal thin film over a one-side surface in the thickness direction of the insulating layer, the inner wall surface of the through hole, and the metal support board in the through hole;

a second opening portion formation step of forming a second opening portion in the second metal thin film, the second opening portion overlapping the first opening end and the second opening end in a projection view in the thickness direction, to expose the metal support board at the through hole; and a conductive layer formation step of forming a conductive layer over a one-side surface in the thickness direction of the second metal thin film and the metal support board in the through hole.

* * * * *